United States Patent
Park et al.

(10) Patent No.: US 11,538,878 B2
(45) Date of Patent: Dec. 27, 2022

(54) DISPLAY DEVICE AND ELECTRONIC APPARATUS

(71) Applicant: Samsung Display Co., Ltd., Yongin-si (KR)

(72) Inventors: Sangha Park, Yongin-si (KR); Kyuhwan Hwang, Yongin-si (KR); Dahee Jeong, Yongin-si (KR); Eunbee Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 17/342,269

(22) Filed: Jun. 8, 2021

(65) Prior Publication Data

US 2022/0037421 A1     Feb. 3, 2022

(30) Foreign Application Priority Data

Jul. 30, 2020 (KR) .................. 10-2020-0095579

(51) Int. Cl.
    *H01L 27/32*     (2006.01)

(52) U.S. Cl.
    CPC .................. *H01L 27/326* (2013.01)

(58) Field of Classification Search
    CPC .................................................... H01L 27/326
    See application file for complete search history.

(56) References Cited

U.S. PATENT DOCUMENTS

| | | | |
|---|---|---|---|
| 8,395,571 | B2 | 3/2013 | Kim et al. |
| 11,043,191 | B1* | 6/2021 | Kang ................. G09G 3/035 |
| 2017/0054111 | A1* | 2/2017 | Kim .................. H01L 51/5271 |
| 2019/0346954 | A1* | 11/2019 | Jung .................. G06F 1/3209 |
| 2020/0098835 | A1 | 3/2020 | Bae et al. |
| 2020/0265779 | A1* | 8/2020 | In .................... G09G 3/3225 |
| 2020/0286451 | A1* | 9/2020 | Kim .................. G09G 3/035 |
| 2021/0012751 | A1* | 1/2021 | An ..................... G09G 5/14 |

FOREIGN PATENT DOCUMENTS

| | | |
|---|---|---|
| CN | 110678983 A | 1/2020 |
| CN | 110890412 A | 3/2020 |
| KR | 10-1015332 B1 | 2/2011 |
| KR | 10-2015-0111780 A | 10/2015 |
| KR | 10-2020-0034290 A | 3/2020 |

* cited by examiner

*Primary Examiner* — Douglas M Menz
(74) *Attorney, Agent, or Firm* — Lewis Roca Rothgerber Christie LLP

(57) ABSTRACT

A display device includes: a first main pixel being configured to emit light of a first color, and a second main pixel being configured to emit light of a second color; and a first auxiliary pixel and a second auxiliary pixel on the second area, the first auxiliary pixel being configured to emit light of the first color, and the second auxiliary pixel being configured to emit light of the second color, wherein a first virtual line passing through a center of an emission area of the first main pixel and a center of an emission area of the first auxiliary pixel is parallel to a first direction, and a second virtual line passing through a center of an emission area of the second main pixel and a center of an emission area of the second auxiliary pixel crosses the first direction.

26 Claims, 20 Drawing Sheets

DISPLAY DEVICE AND ELECTRONIC APPARATUS

CROSS-REFERENCE TO RELATED APPLICATION

The present application claims priority to and the benefit of Korean Patent Application No. 10-2020-0095579, filed on Jul. 30, 2020, in the Korean Intellectual Property Office, the entire disclosure of which is incorporated herein by reference.

BACKGROUND

1. Field

Aspects of one or more example embodiments relate to a display device and an electronic apparatus.

2. Description of the Related Art

In general, display devices include a display element and electronic elements for controlling an electrical signal applied to the display element. The electronic elements include a thin-film transistor (TFT), a storage capacitor, and a plurality of wires.

Recently, the use of display devices has diversified. In addition, because display devices have become thinner and lighter, their range of uses has expanded. As the range of uses of display devices has become more diversified, various methods of designing the shapes of the display devices have been studied.

The above information disclosed in this Background section is only for enhancement of understanding of the background and therefore the information discussed in this Background section does not necessarily constitute prior art.

SUMMARY

Aspects of one or more example embodiments relate to a display device and an electronic apparatus, and for example, to a display device in which boundary visibility is minimized in a display area.

In display devices, the boundary of the display area may be perceived by viewers.

Aspects of one or more example embodiments include a display device in which the boundary visibility of a display area is minimized or reduced. However, such a characteristic is merely an example characteristic of some example embodiments, and the disclosure is not limited thereto.

Additional aspects will be set forth in part in the description which follows and, in part, will be more apparent from the description, or may be learned by practice of the presented example embodiments.

According to one or more example embodiments, a display device includes a substrate including a first area and a second area in contact with the first area, a first main pixel and a second main pixel arranged on the first area, the first main pixel emitting light of a first color, and the second main pixel emitting light of a second color, and a first auxiliary pixel and a second auxiliary pixel arranged on the second area, the first auxiliary pixel emitting light of the first color, and the second auxiliary pixel emitting light of the second color, wherein a first virtual line passing through a center of an emission area of the first main pixel and a center of an emission area of the first auxiliary pixel is parallel to a first direction, and a second virtual line passing through a center of an emission area of the second main pixel and a center of an emission area of the second auxiliary pixel crosses the first direction.

According to some example embodiments, the first auxiliary pixel may be arranged closer to the first area than the second auxiliary pixel.

According to some example embodiments, a shortest distance between the first main pixel and the first auxiliary pixel may be less than a shortest distance between the second main pixel and the second auxiliary pixel.

According to some example embodiments, an angle between the first virtual line and the second virtual line may be 45° or less.

According to some example embodiments, the first main pixel and the first auxiliary pixel may emit green light.

According to some example embodiments, the second main pixel and the second auxiliary pixel may emit red or blue light.

According to some example embodiments, the area of the emission area of the first main pixel may be less than the area of the emission area of the second main pixel, and the area of the emission area of the first auxiliary pixel may be less than the area of the emission area of the second auxiliary pixel.

According to some example embodiments, the display device may further include a third main pixel arranged on the first area and emitting light of a third color, and a third auxiliary pixel arranged on the second area and emitting light of the third color.

According to some example embodiments, a third virtual line passing through a center of an emission area of the third main pixel and a center of an emission area of the third auxiliary pixel may cross the first direction.

According to some example embodiments, the second virtual line and the third virtual line may cross each other.

According to some example embodiments, a fourth virtual line passing through each of the center of the emission area of the second main pixel and a center of an emission area of a third main pixel may be spaced apart from and parallel to the first virtual line, and the second auxiliary pixel may not be arranged on the fourth virtual line.

According to some example embodiments, the display device may further include a third auxiliary pixel arranged on the second area and emitting light of a third color, wherein a fifth virtual line passing through the center of the emission area of the second auxiliary pixel and a center of an emission area of the third auxiliary pixel mat be spaced apart from and parallel to the fourth virtual line.

According to some example embodiments, the first main pixel and the first auxiliary pixel, which are arranged on the first area, and the second main pixel and the second auxiliary pixel, which are arranged on the second area, may each be arranged in a pentile type.

According to some example embodiments, the area of the emission area of the first auxiliary pixel may be greater than the area of the emission area of the first main pixel.

According to one or more example embodiments, a display device includes a substrate including a first area and a second area in contact with the first area, a first main pixel and a second main pixel arranged on the first area, the first main pixel emitting light of a first color, and the second main pixel emitting light of a second color, and a first auxiliary pixel and a second auxiliary pixel arranged on the second area, the first auxiliary pixel emitting light of the first color, and the second auxiliary pixel emitting light of the second color, wherein the area of an emission area of the first main pixel is less than the area of an emission area of the second main pixel, the area of an emission area of the first auxiliary pixel is less than the area of an emission area of the second auxiliary pixel, and the first auxiliary pixel is arranged closer to the first area than the second area.

According to some example embodiments, the first main pixel and the first auxiliary pixel may emit green light.

According to some example embodiments, the first main pixel and the first auxiliary pixel, and the second main pixel and the second auxiliary pixel may be closest to each other at a boundary between the first area and the second area.

According to some example embodiments, a shortest distance between the first main pixel and the first auxiliary pixel may be less than a shortest distance between the second main pixel and the second auxiliary pixel.

According to some example embodiments, the first main pixel and the second main pixel, which are arranged on the first area, may be arranged in a pentile type, and the first auxiliary pixel and the second auxiliary pixel, which are arranged on the second area, may be arranged in a stripe type.

According to some example embodiments, the display device may further include a component arranged to overlap the second area.

According to some example embodiments, the second area may be at at least one corner portion of the display area, and at least a portion of the substrate corresponding to the second area may include a through portion.

According to some example embodiments, a first virtual line passing through a center of the emission area of the first main pixel and a center of the emission area of the first auxiliary pixel may be parallel to a first direction.

According to some example embodiments, a second virtual line passing through a center of the emission area of the second main pixel and a center of the emission area of the second auxiliary pixel may cross the first direction.

According to some example embodiments, an angle between the first virtual line and the second virtual line may be 45° or less.

According to some example embodiments, the area of the emission area of the first auxiliary pixel may be greater than the area of the emission area of the first main pixel.

According to one or more example embodiments, an electronic apparatus includes a display device including a first area and a second area in contact with the first area, the display device including an array of a plurality of main pixels arranged on the first area, and an array of a plurality of auxiliary pixels arranged on the second area, and a component arranged to overlap the second area, wherein the display device includes a first main pixel and a second main pixel arranged on the first area, the first main pixel emitting light of a first color, and the second main pixel emitting light of a second color, and a first auxiliary pixel and a second auxiliary pixel arranged on the second area, the first auxiliary pixel emitting light of the first color, and the second auxiliary pixel emitting light of the second color, wherein a first virtual line passing through a center of an emission area of the first main pixel and a center of an emission area of the first auxiliary pixel is parallel to a first direction, and a second virtual line passing through the center of the emission area of the second main pixel and the center of the emission area of the second auxiliary pixel crosses the first direction.

The above and other aspects, features, and characteristics of certain example embodiments according to the present disclosure will be more apparent from the following description, the accompanying drawings, and claims.

BRIEF DESCRIPTION OF THE DRAWINGS

The above and other aspects, features, and characteristics of certain example embodiments will be more apparent from the following description taken in conjunction with the accompanying drawings, in which.

DETAILED DESCRIPTION

Figure 1A:
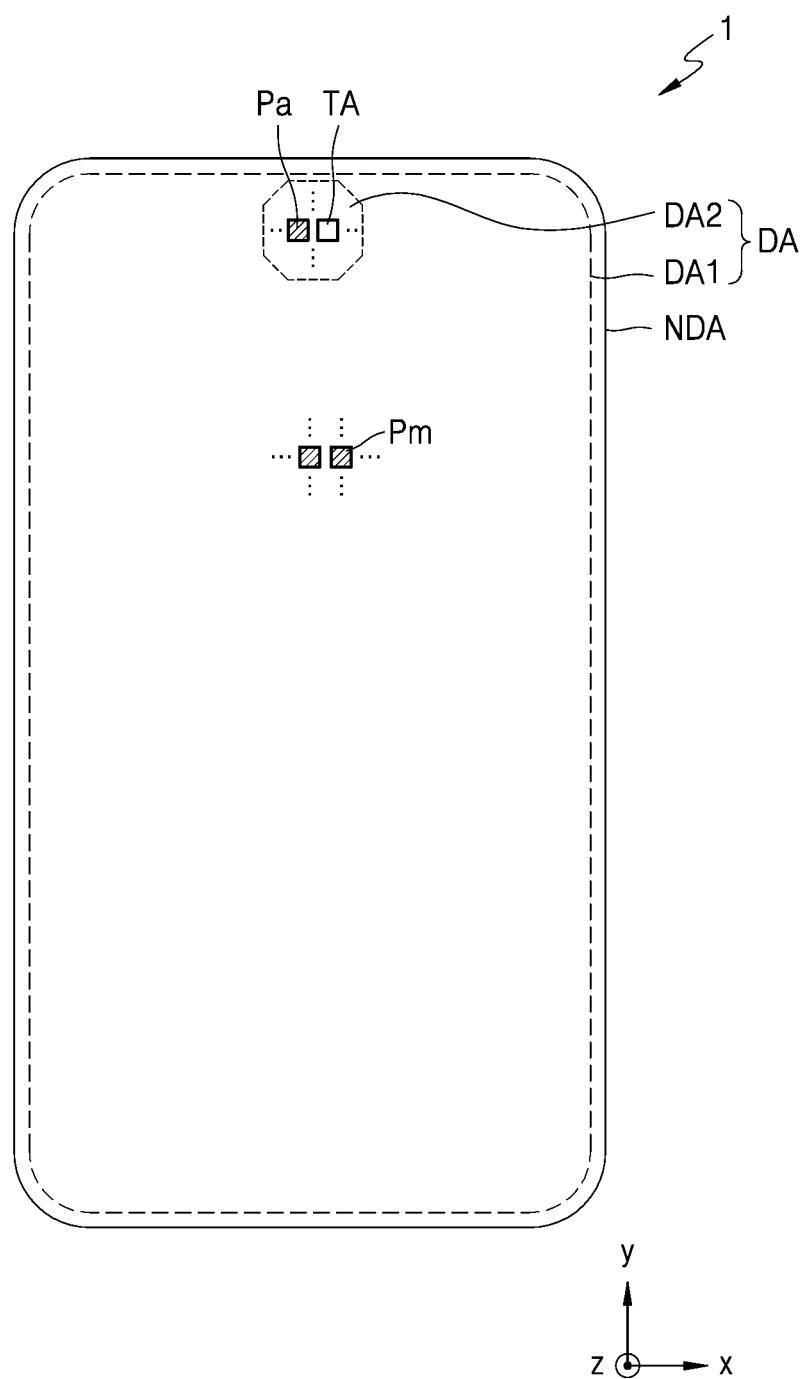
FIGS. 1A and 1B are schematic plan views of an electronic apparatus including a display device according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinbelow, aspects of some example embodiments will be described with reference to the accompanying drawings, wherein like reference numerals refer to like elements throughout and some repeated description thereof may be omitted.

It will be understood that although the terms "first," "second," etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

In the following embodiments, it will be understood that when a layer, region, or element is referred to as being "connected to" or "coupled to" another layer, region, and element, it may be directly or indirectly connected or coupled to the other layer, region, or element. That is, for example, intervening layers, regions, or elements may be present. For example, when layers, regions, or elements are referred to as being electrically connected to each other, they may be directly electrically connected to each other or indirectly electrically connected to each other with intervening layers, regions, or elements therebetween.

In the present specification, the expression "A and/or B" indicates only A, only B, or both A and B. The expression "at least one of A or B" indicates only A, only B, or both A and B.

The x-axis, the y-axis, and the z-axis are not limited to three axes of the rectangular coordinate system, and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated or reduced for convenience of explanation. For example, because sizes and thicknesses of elements in the drawings are arbitrarily illustrated for convenience of explanation, the disclosure is not limited thereto.

A display device included in electronic apparatuses 1, 1', and 1" described below with reference to the accompanying drawings is a device for displaying a video or still images, and may be used as a display screen of portable electronic devices, such as mobile phones, smartphones, tablet personal computers (PCs), mobile communication terminals, electronic notebooks, electronic books, portable multimedia players (PMPs), navigations, and ultra mobile PCs (UMPCs), as well as various products such as televisions, laptop computers, monitors, advertisement boards, and Internet of Things (IoT) devices. Also, the display device according to some example embodiments may be used in wearable devices such as smartwatches, watch phones, glasses-type displays, and a head-mounted displays (HMDs). Further, the display device according to some example embodiments may be used as a center information display (CID) arranged on an instrument panel of a vehicle, a center fascia, or a dashboard of a vehicle, a room mirror display functioning in place of a side mirror of a vehicle, and a display arranged on the back of a front seat as an entertaining element for a rear seat of a vehicle.

Figure 1B:
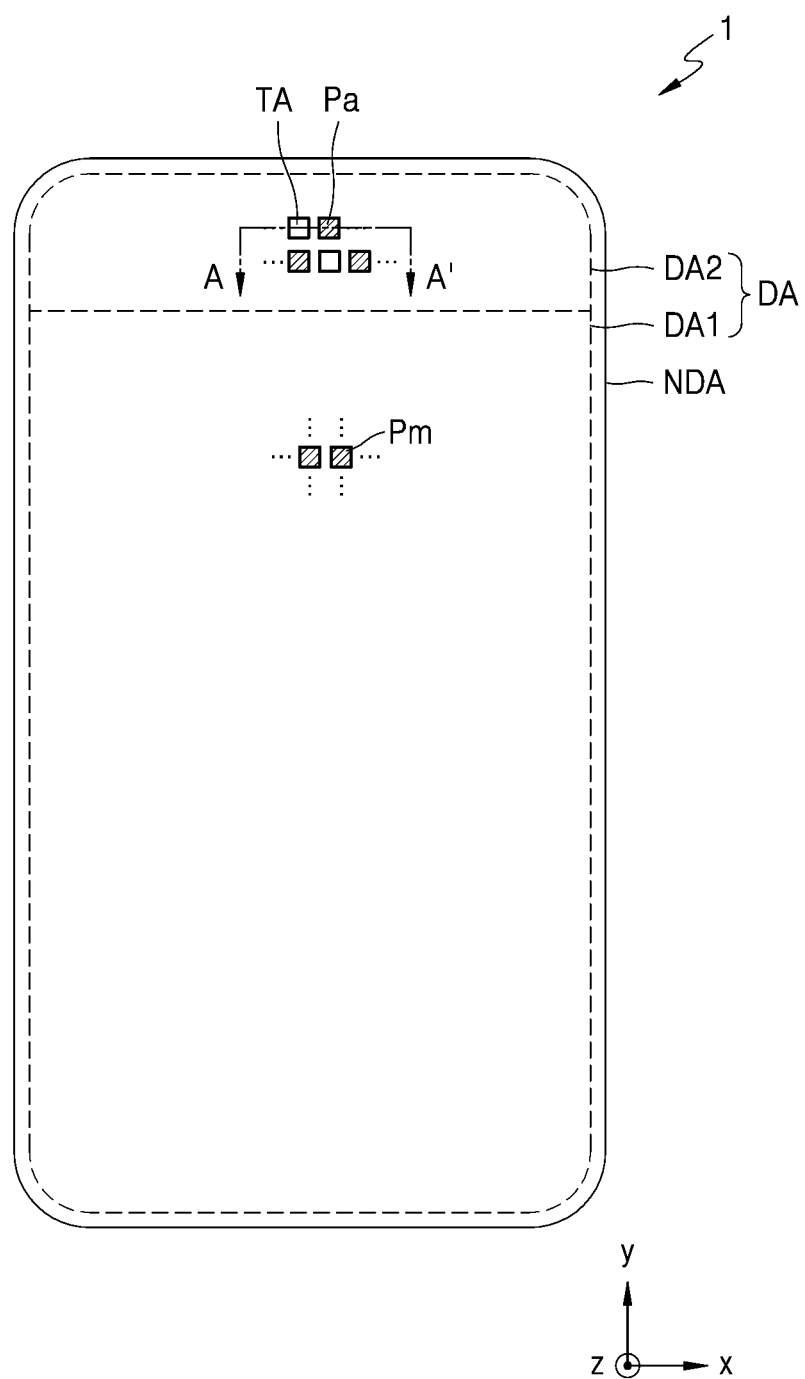

FIGS. 1A and 1B are schematic plan views of an electronic apparatus 1 including a display device according to some example embodiments.

Referring to FIGS. 1A and 1B, the electronic apparatus 1 may include a display area DA, and a peripheral area NDA outside the display area DA. The display area DA may include a first area DA1 defined as a main display area, and a second area DA2 defined as an auxiliary display area or a component area. The second area DA2 may be arranged so that at least a portion thereof is in contact with the first area DA1. According to some example embodiments, the second area DA2 may be partially or completely surrounded by the first area DA1.

The electronic apparatus 1 may display images through an array of a plurality of pixels that are two-dimensionally arranged in the display area DA (e.g., the first area DA1 and the second area DA2). The pixels may include main pixels Pm arranged in the first area DA1 and auxiliary pixels Pa arranged in the second area DA2. The first area DA1 and the second area DA2 may display images individually (e.g., such that they display separate images) or together (e.g., such that they each display a portion of the same image to collectively display the entirety of the same image).

The peripheral area NDA may be a non-display area in which no display elements are arranged. The display area DA may be entirely surrounded by the peripheral area NDA. A driver for providing an electrical signal or power to the main pixels Pm and the auxiliary pixels Pa may be arranged in the peripheral area NDA. A pad, which is an area to which an electronic element or a printed circuit board may be electrically connected, may be arranged in the peripheral area NDA.

Figure 3A:
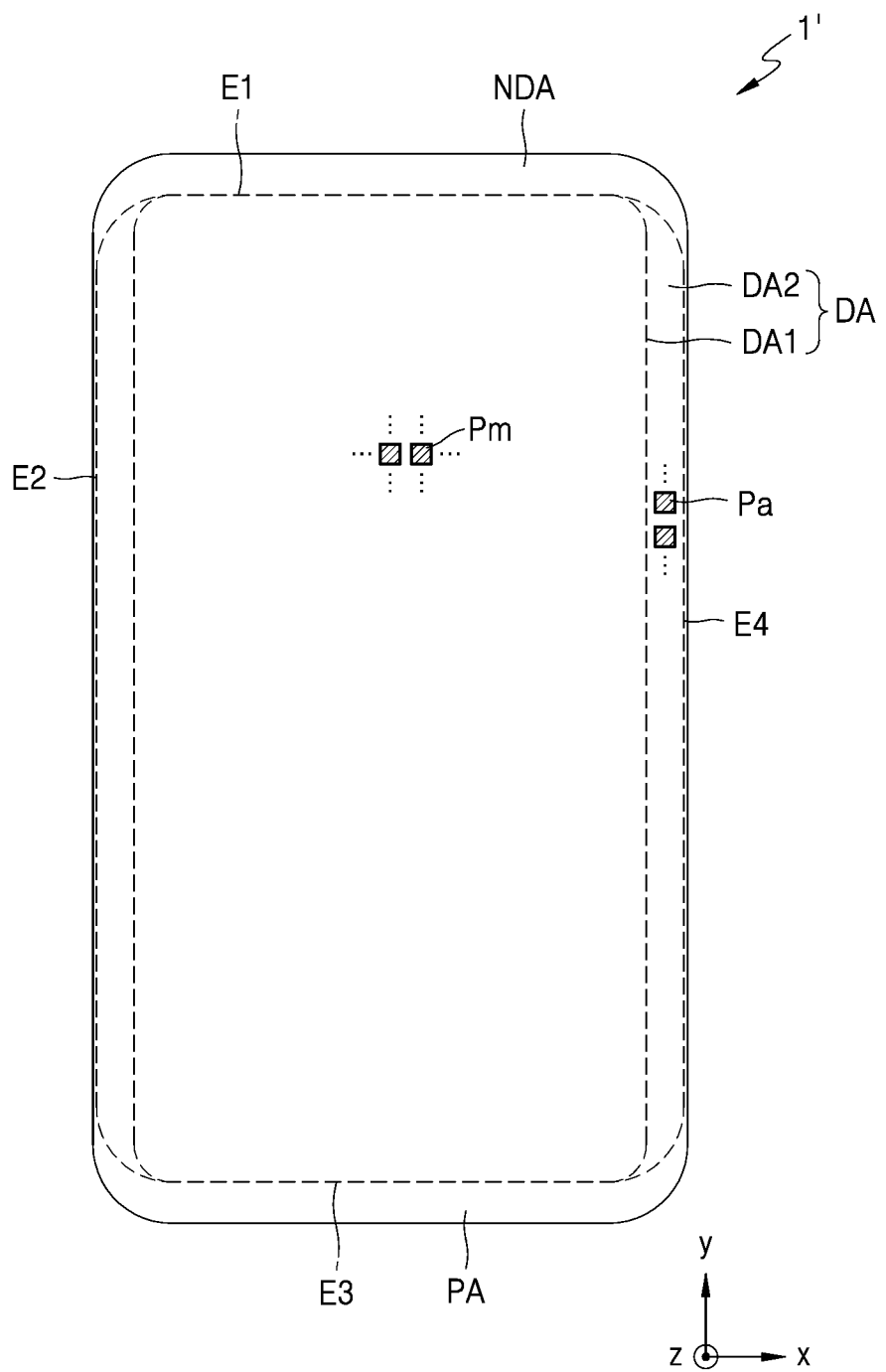
FIGS. 3A and 3B are schematic plan views of an electronic apparatus including a display device according to some example embodiments.
Figure 5:
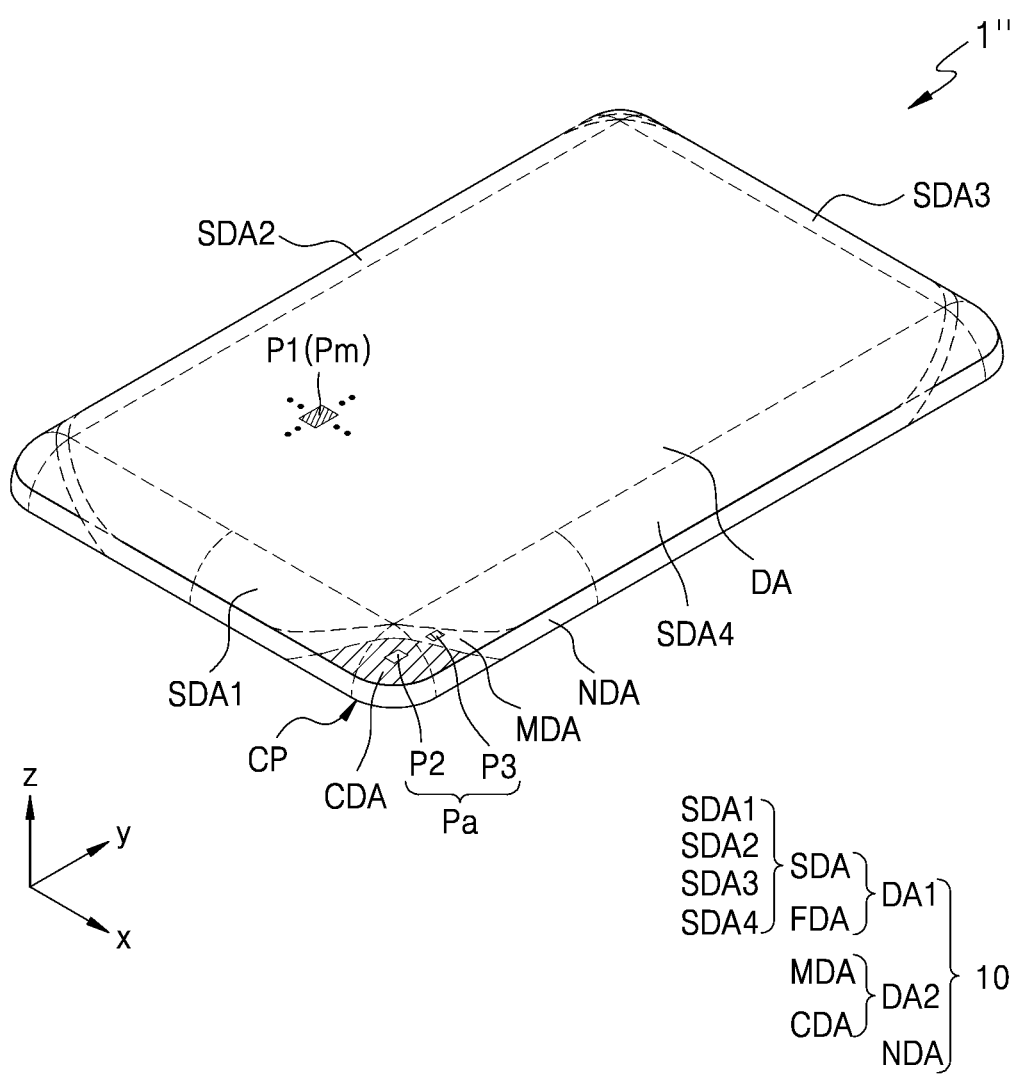
FIG. 5 is a schematic perspective view of an electronic apparatus according to some example embodiments.

FIG. 1A illustrates that one second area DA2 is in the first area DA1. Alternatively, as shown in FIG. 1B, the second area DA2 may be on one side of the first area DA1. According to some example embodiments, the electronic apparatus 1 may include two or more second areas DA2 as shown in FIGS. 3A and 5 to be described below, and shapes and sizes of the second areas DA2 may be the same as or different from each other. A ratio of the size of the area of the second area DA2 to the size of the overall display area DA may be less than a ratio of the size of the first area DA1 to the size of the overall display area DA.

When viewed in a direction substantially perpendicular to an upper surface of the electronic apparatus 1 (e.g., when viewed in a plan view, or from a view normal or perpendicular with respect to the display surface of the display area DA), the second area DA2 may have a circular shape that is approximately octagonal as shown in FIG. 1A, or a bar-type rectangular shape as shown in FIG. 1B. The shame of the second display area DA2 is not limited thereto, however, and the second display area DA2 may have any suitable shape according to the design of the electronic apparatus 1.

For example, the second area DA2 may have various shapes including a polygon such as a hexagon or the like, a circle, an ellipse, a star, or a diamond shape. Also, when viewed in the direction substantially perpendicular (e.g., normal) to the upper surface of the electronic apparatus 1, FIG. 1A illustrates that the second area DA2 is arranged in the upper center (a +y direction) of the display area DA having corners each having a substantially round rectangular shape, but the second area DA2 may be arranged on one side of the display area DA, for example, the upper right side or the upper left side of the display area DA. That is the location of the second area DA2 within the display area DA may vary according to the design of the electronic apparatus 1.

The second area DA2 may include a transmission area TA between the auxiliary pixels Pa. The transmission area TA is an area through which light may pass, and a pixel may not be arranged therein.

The auxiliary pixels Pa may be arranged in the second area DA2. Each of the auxiliary pixels Pa includes at least one sub-pixel and may be implemented by a display element such as an organic light-emitting diode (OLED). Each of the auxiliary pixels Pa may emit at least one of, for example, red, green, blue, or white light.

The transmission area TA may be arranged to surround the auxiliary pixels Pa. Alternatively, the transmission area TA may be alternately arranged with the auxiliary pixels Pa.

Because the second area DA2 includes the transmission area TA, a resolution of the second area DA2 may be lower than a resolution of the first area DA1. For example, the resolution of the second area DA2 may be about ½, ⅜, ⅓, ¼, ⅖, ⅛, ⅑, or ¹⁄₁₆ of the resolution of the first area DA1. For example, the resolution of the second area DA2 may be about 200 ppi or about 100 ppi, and the resolution of the first area DA1 may be about 400 ppi or higher.

The main pixels Pm may be arranged in the first area DA1. Each of the main pixels Pm includes at least one sub-pixel and may be implemented by a display element such as an OLED. Each of the main pixels Pm may emit, for example, red, green, blue, or white light.

As described below with reference to FIG. 2A or 2B, in the second area DA2, a component 20 (see FIG. 2), which is an electronic element, may be arranged under a display device 10, to correspond to the second area DA2.

Examples of the electronic apparatus 1 may include mobile phones, tablet PCs, laptop computers, smartwatches or smart bands worn on a wrist, etc.

Hereinbelow, although an organic light-emitting display device is described as an example of the display device 10 included in the electronic apparatus 1 according to some example embodiments, the display device according to the disclosure is not limited thereto. According to some example embodiments, the display device 10 according to some example embodiments may be an inorganic light-emitting display, an inorganic electroluminescence (EL) display, or a quantum dot light-emitting display. For example, an emission layer of a display element provided in the display device 10 may include an organic material, an inorganic material, quantum dots, an organic material and quantum dots, or an inorganic material and quantum dots.

Figure 2A:
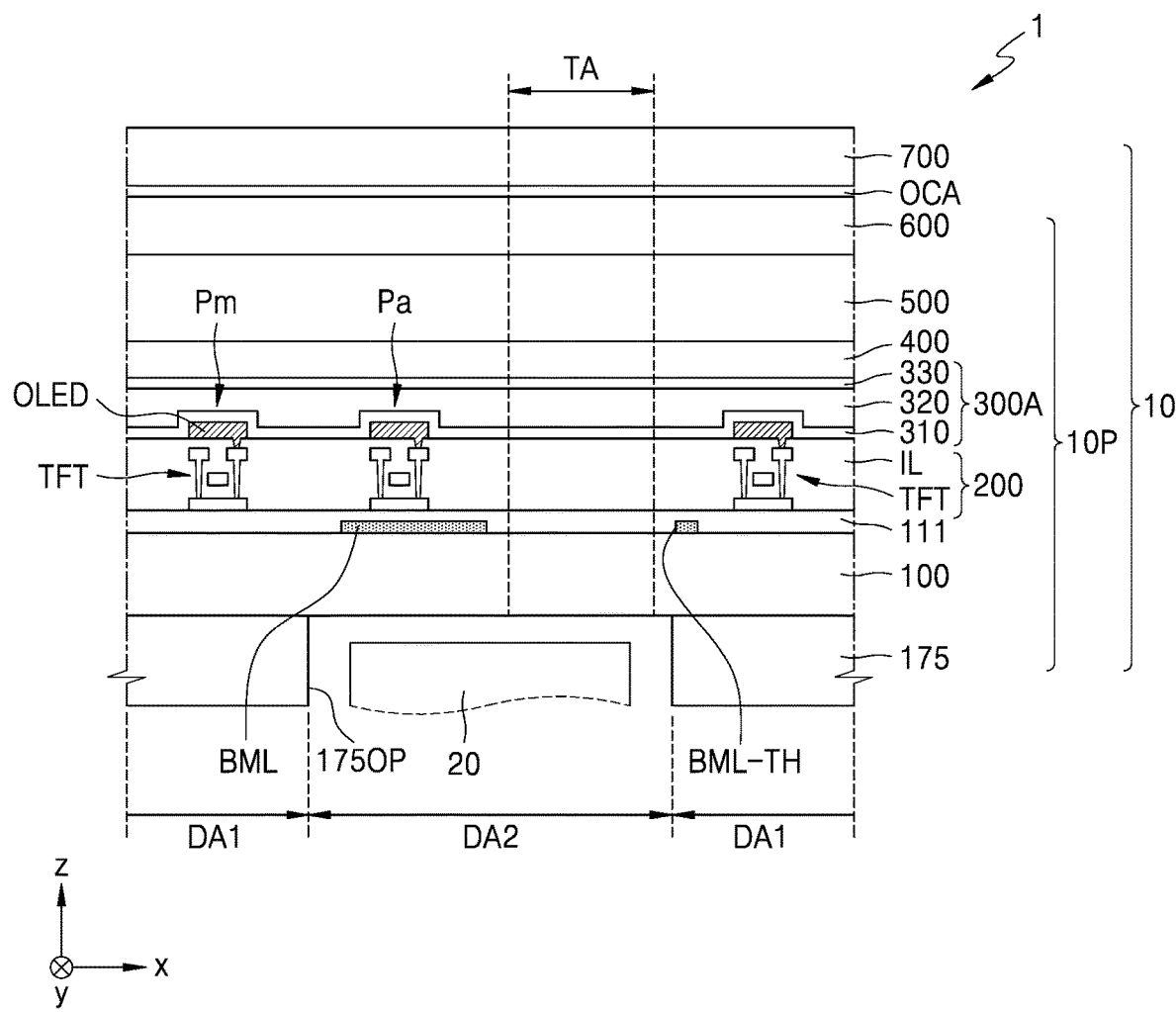
FIGS. 2A and 2B are cross-sectional views of a portion of an electronic apparatus including a display device according to some example embodiments.
Figure 2B:
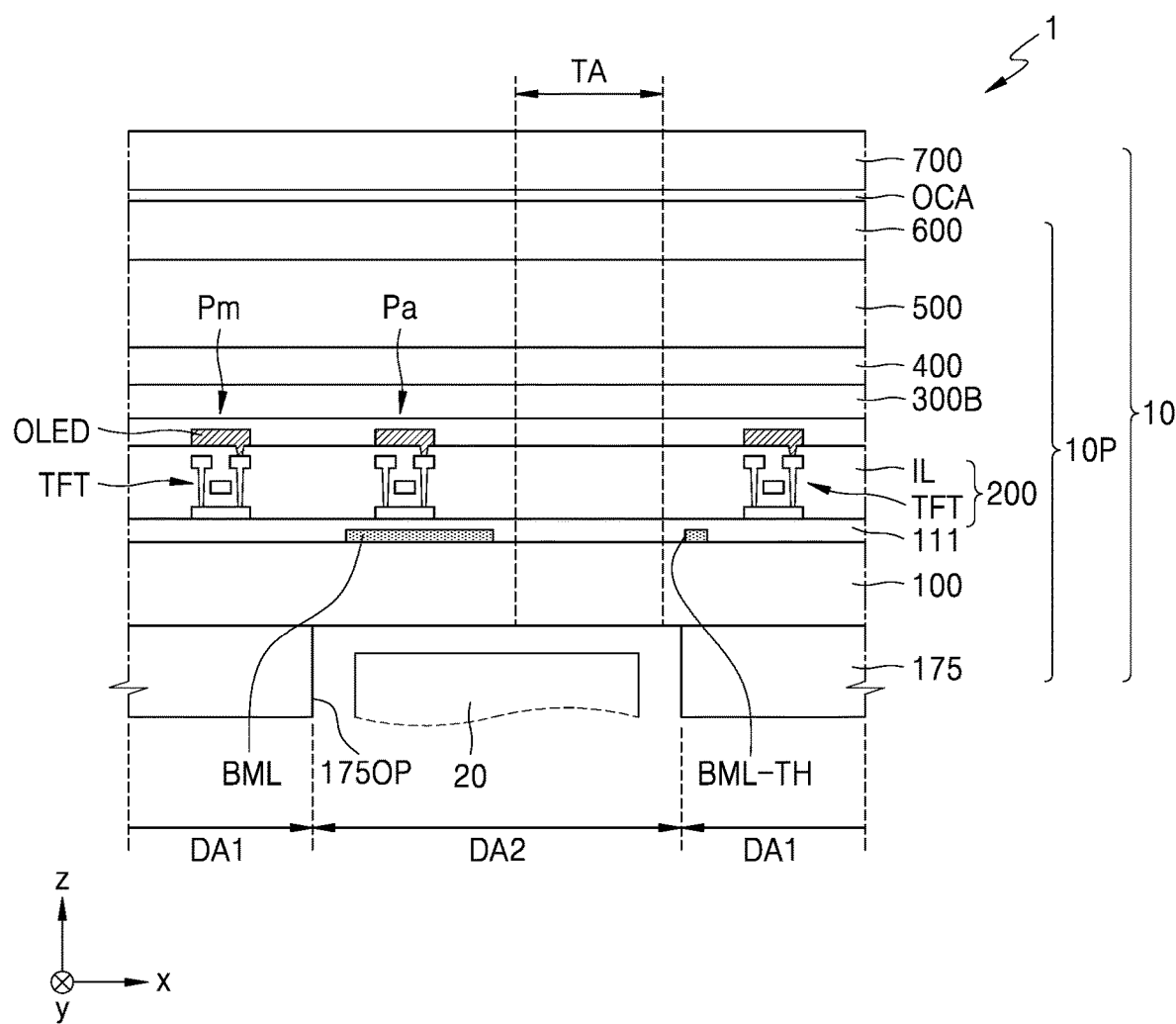

FIGS. 2A and 2B are cross-sectional views of a portion of an electronic apparatus 1 including a display device 10 according to some example embodiments.

Referring to FIGS. 2A and 2B, the electronic apparatus 1 may include the display device 10 and a component 20 overlapping the display device 10.

The display device 10 may include a display panel 10P and a cover window 700 above the display panel 10P, the display panel 10P including a substrate 100, a display layer 200 arranged on the substrate 100, a thin-film encapsulation layer 300A on the display layer 200, an input sensing layer 400, an optical functional layer 500, and an anti-reflective layer 600.

The component 20 may be in the second area DA2. The component 20 may be an electronic element using light or sound. For example, the electronic element may be a sensor that measures a distance, such as a proximity sensor, a sensor that recognizes a part of a user's body (e.g., a fingerprint, an iris, a face, etc.), a small lamp that outputs light, an image sensor (e.g., a camera) that captures an image, etc. The electronic element using light may use light of various wavelength bands, such as visible light, infrared light, and ultraviolet light. The electronic element using sound may use ultrasonic waves or sound of other frequency bands. In some embodiments, the component 20 may include sub-components such as a light-emitting portion and a light-receiving portion. The light-emitting portion and the light-receiving portion may have an integrated structure or a physically separated structure, so that a pair of the light-emitting portion and the light-receiving portion may constitute one component 20.

The substrate 100 may include glass or a polymer resin. For example, the substrate 100 may include a polymer resin such as polyethersulfone, polyacrylate, polyether imide, polyethylene naphthalate, polyethylene terephthalide, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the aforementioned polymer resin and an inorganic layer (not shown).

The display layer 200 is arranged on a front surface of the substrate 100, and a lower protective film 175 may be arranged on a rear surface of the substrate 100. The lower protective film 175 may be attached to the rear surface of the substrate 100. An adhesive layer may be between the lower protective film 175 and the substrate 100. Alternatively, the lower protective film 175 may be directly formed on the rear surface of the substrate 100, and in this case, the adhesive layer is not between the lower protective film 175 and the substrate 100.

The lower protective film 175 may support and protect the substrate 100. The lower protective film 175 may include an opening 175OP corresponding to the second area DA2. The opening 175OP of the lower protective film 175 is a concave portion formed by removing a portion of the lower protective film 175 in a thickness direction thereof. According to some example embodiments, the opening 175OP of the lower protective film 175 may be formed by completely removing the portion of the lower protective film 175 in the thickness direction thereof, and in this case, the opening 175OP may have a shape of a through hole as shown in FIGS. 2A and 2B. According to some example embodiments, the opening 175OP of the lower protective film 175 may be formed by partially removing the portion of the lower protective film 175 in the thickness direction thereof, and thus the opening 175OP may have a shape of a recessed blind-hole that does not completely penetrate the lower protective film 175 as shown in FIG. 2A.

Because the lower protective film 175 includes the opening 175OP, a transmittance of the second area DA2, for example, a light transmittance of the transmission area TA, may be relatively improved. The lower protective film 175 may include an organic insulating layer such as polyethylene terephthalate (PET) or polyimide (PI).

The display layer 200 may include a plurality of pixels. The display layer 200 may include a display element layer including an organic light-emitting diode OLED that is a display element, a circuit layer including a thin-film transistor TFT electrically connected to the organic light-emitting diode OLED, and an insulating layer IL. The thin-film transistor TFT and the organic light-emitting diode OLED electrically connected to the thin-film transistor TFT may be arranged in the first area DA1 and the second area DA2, respectively.

The second area DA2 may include the transmission area TA in which the thin-film transistor TFT and the organic light-emitting diode OLED are not arranged. The transmission area TA is an area through which light emitted from the component 20 and/or light directed to the component 20 may be transmitted. In the display device 10, a transmittance of the transmission area TA may be about 30% or higher, about 40% or higher, about 50% or higher, about 60% or higher, about 70% or higher, about 75% or higher, about 80% or higher, about 85% or higher, or about 90% or higher.

A bottom metal layer BML may be between the substrate 100 and the display layer 200, for example, between the substrate 100 and the thin-film transistor TFT. The bottom metal layer BML may include a through hole BML-TH through which light emitted from the component 20 or light directed to the component 20 may pass. The through hole BML-TH of the bottom metal layer BML is in the transmission area TA. A portion of the bottom metal layer BML, in which the through hole BML-TH is not formed, may prevent or reduce instances of light being diffracted through a pixel circuit PC (see FIG. 9A or 9B) arranged in the second area DA2 or a narrow gap between wires connected to the pixel circuit PC, and may relatively improve the performance of the thin-film transistor TFT. The portion of the bottom metal layer BML is not in the transmission area TA. For example, the bottom metal layer BML may include hole(s) in the transmission area TA.

The display layer 200 may be sealed with an encapsulation member. In some embodiments, the encapsulation member may include the thin-film encapsulation layer 300A as shown in FIG. 2A. The thin-film encapsulation layer 300A may include at least one inorganic encapsulation layer and at least one organic encapsulation layer. According to some example embodiments, the thin-film encapsulation layer 300A may include a first inorganic encapsulation layer 310, a second inorganic encapsulation layer 330, and an organic encapsulation layer 320 therebetween.

According to some example embodiments, the encapsulation member may include an encapsulation substrate 300B as shown in FIG. 2B. The encapsulation substrate 300B may be arranged to face the substrate 100 with the display layer 200 therebetween. A gap may be between the encapsulation substrate 300B and the display layer 200. The encapsulation substrate 300B may include glass. A sealant is arranged between the substrate 100 and the encapsulation substrate 300B, and the sealant may be arranged in the peripheral area NDA described above with reference to FIG. 1A or 1B. The sealant arranged in the peripheral area NDA may surround the display area DA and prevent or reduce instances of moisture penetrating through side surfaces of the display area DA.

The input sensing layer 400 may obtain coordinate information according to an external input, for example, a touch event using an object such as a finger or a stylus pen. The input sensing layer 400 may include a touch electrode, and trace lines connected to the touch electrode. The input sensing layer 400 may sense an external input using a mutual capacitance method or a self-capacitance method.

The input sensing layer 400 may be formed on the encapsulation member. Alternatively, the input sensing layer 400 may be separately formed and then coupled onto the encapsulation member using an adhesive layer such as an optical clear adhesive OCA. According to some example embodiments, as shown in FIGS. 2A and 2B, the input sensing layer 400 may be directly formed on the thin-film encapsulation layer 300A or the encapsulation substrate 300B, and in this case, the adhesive layer may not be between the input sensing layer 400 and the thin-film encapsulation layer 300A or the encapsulation substrate 300B.

The optical functional layer 500 may relatively improve the light efficiency. For example, the front light efficiency and/or side visibility of light emitted from the organic light-emitting diode OLED may be relatively improved, and diffraction of light passing through the transmission area TA toward the component 20 may be minimized, reduced, or prevented.

The anti-reflective layer 600 may reduce a reflectance of light (external light) incident from the outside toward the display device 10.

According to some example embodiments, the anti-reflective layer 600 may include an optical plate including a retarder and/or a polarizer. The retarder may include a film-type retarder or a liquid crystal coating-type retarder, and may include a $\lambda/2$ retarder and/or a $\lambda/4$ retarder. The polarizer may also include a film-type polarizer or a liquid crystal coating-type polarizer. The film-type polarizer may include a stretchable synthetic resin, and the liquid crystal coating-type polarizer may include liquid crystals arranged in a certain arrangement.

According to some example embodiments, the anti-reflective layer 600 may include a filter plate including a black matrix and color filters. The filter plate may include color filters, a black matrix, and an overcoat layer arranged for each pixel.

According to some example embodiments, the anti-reflective layer 600 may include a destructive interference structure. The destructive interference structure may include a first reflective layer and a second reflective layer, which are arranged on different layers. First reflected light and second reflected light reflected respectively from the first reflective layer and the second reflective layer may destructively interfere with each other, and thus a reflectance of external light may be reduced.

The cover window 700 may be arranged above the display panel 10P. The cover window 700 may be arranged on the anti-reflective layer 600 and may be coupled to the anti-reflective layer 600 using an adhesive layer such as an OCA. Although FIGS. 2A and 2B illustrate that the cover window 700 is arranged over the anti-reflective layer 600, according to some example embodiments, positions of the anti-reflective layer 600 and the optical functional layer 500 may be switched with one another. In this case, the cover window 700 may be coupled to the optical functional layer 500 using an adhesive layer such as an OCA. According to some example embodiments, the OCA may be omitted between the cover window 700 and a layer under the cover window 700 (e.g., the anti-reflective layer 600 or the optical functional layer 500).

One component 20 or a plurality of components 20 may be arranged in the second area DA2. When the electronic apparatus 1 includes a plurality of components 20, the electronic apparatus 1 may include a plurality of second areas DA2 corresponding to the number of components 20. For example, the electronic apparatus 1 may include a plurality of second areas DA2 apart from each other. According to some example embodiments, the components 20 may be arranged in one second area DA2. For example, the electronic apparatus 1 may include a bar-type second area DA2 as described above with reference to FIG. 1B, and the components 20 may be arranged to be spaced apart from each other in a lengthwise direction (e.g., an x-direction of FIG. 1) of the second area DA2.

Figure 3B:
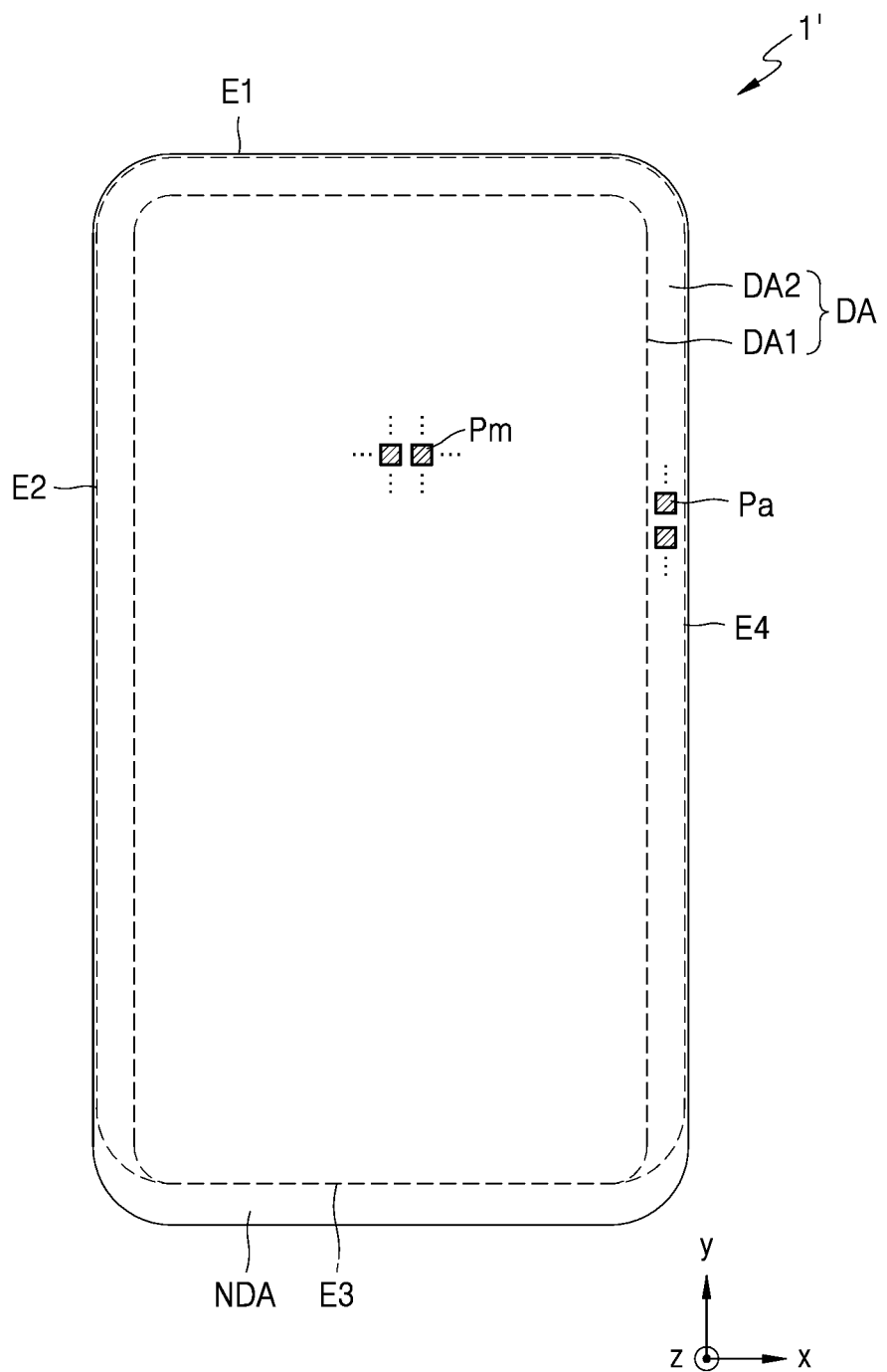
Figure 4:
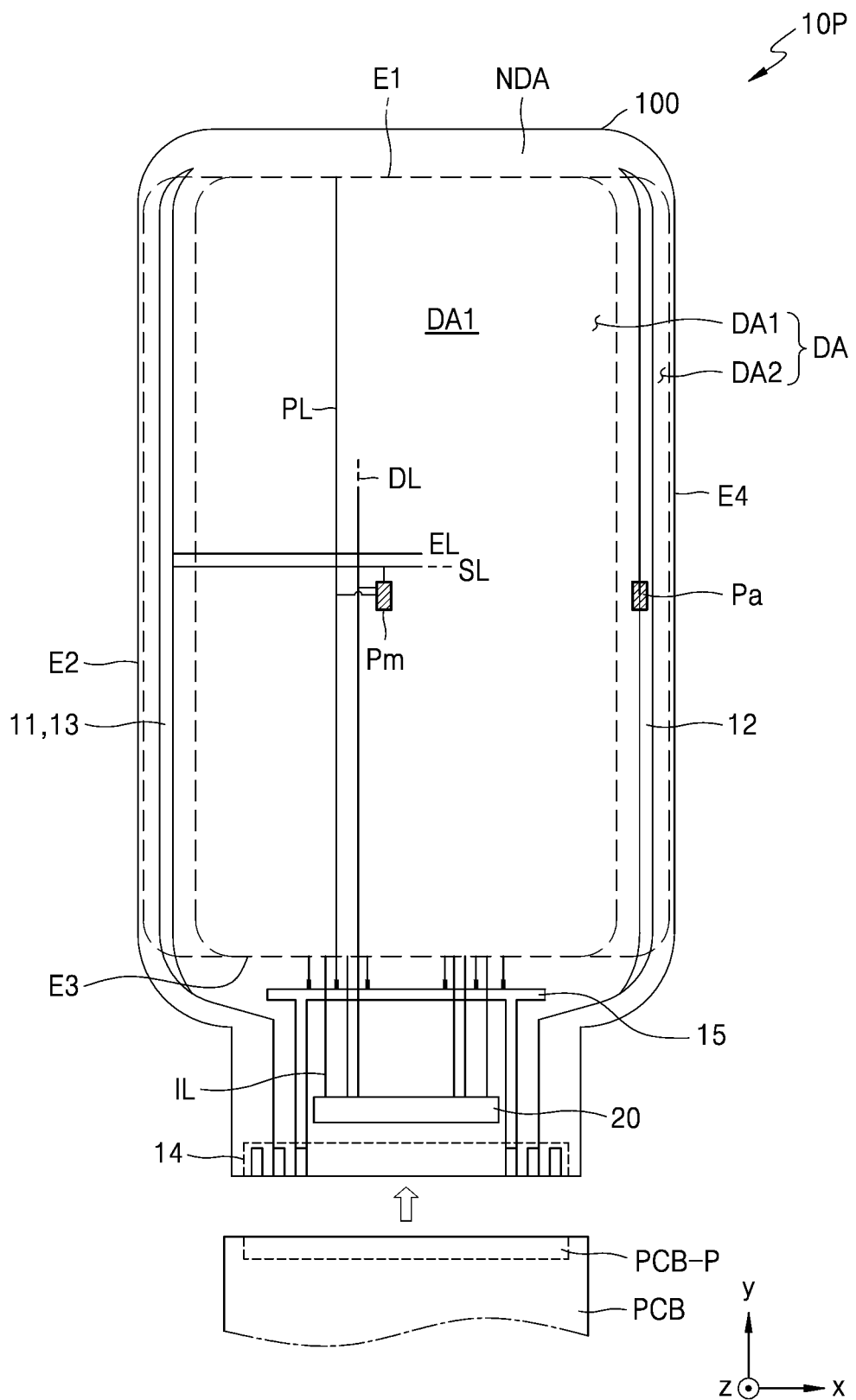
FIG. 4 is a schematic plan view of a display device included in an electronic apparatus according to some example embodiments.

FIGS. 3A and 3B are schematic plan views of an electronic apparatus 1' including a display device according to some example embodiments, and FIG. 4 is a schematic plan view of a display device 10 included in an electronic apparatus according to some example embodiments.

Referring to FIGS. 3A and 3B, the electronic apparatus 1' may include a first area DA1 defined as a main display area of the display area DA, and a second area DA2 defined as an auxiliary display area of the display area DA. The second area DA2 may be arranged so that at least a portion thereof is in contact with the first area DA1.

The electronic apparatus 1' shown in FIGS. 3A and 3B is substantially similar to that of FIGS. 1A and 1B described above, but there is a difference in that the second area DA2 is arranged outside the first area DA1. Other configurations are the same as those of the aforementioned embodiments, and thus differences are mainly described below.

In the display area DA of the electronic apparatus 1', the second area DA2 may partially overlap the peripheral area NDA which is a non-display area in FIGS. 1A and 1B. Auxiliary pixels Pa may be arranged in the second area DA2. Accordingly, when the second area DA2 partially overlaps the peripheral area NDA which is a non-display area in FIGS. 1A and 1B, it may indicate that a driving circuit portion is arranged under the second area DA2, and a display element, for example, an organic light-emitting diode OLED, of each of the auxiliary pixels Pa is arranged above the second area DA2. The organic light-emitting diode OLED of each of the auxiliary pixels Pa may receive a signal and/or a voltage from a pixel circuit of a main pixel Pm arranged in an adjacent area, for example, the first area DA1.

Referring to FIG. 3A, in the electronic apparatus 1', the display area DA may include first to fourth edges E1 to E4. According to some example embodiments, the first edge E1 and the third edge E3 may be arranged symmetrically with and parallel to each other. The peripheral area NDA, which is the non-display area, may be arranged outside the first edge E1 and the third edge E3.

The second edge E2 and the fourth edge E4 may be arranged symmetrically with and parallel to each other. When viewed from the front, the second edge E2 and the fourth edge E4 may substantially match an edge of the electronic apparatus 1'. That is, the display area DA of the electronic apparatus 1' according to some example embodiments may be expanded as much as possible in one direction (e.g., the x-direction), and a full screen display may be implemented when viewed from the front.

According to some example embodiments, the second area DA2 may be provided to surround at least three corners of the first area DA1 as shown in FIG. 3B. In this case, the peripheral area NDA may be arranged only outside the third edge E3. The first edge E1 may substantially match the edge of the electronic apparatus 1', similar to the second edge E2 and the fourth edge E4.

FIG. 4 illustrates a display panel 10P included in the electronic apparatus 1' of FIG. 3A or 3B.

Referring to FIG. 4, the display panel 10P includes a substrate 100. Various elements constituting the display panel 10P are arranged on the substrate 100.

The display area DA may include a first area DA1 that displays a main image, and a second area DA2 that displays an auxiliary image. Main pixels Pm may be arranged on the first area DA1, and auxiliary pixels Pa may be arranged on the second area DA2. Each of the main pixels Pm and/or the auxiliary pixels Pa includes at least one sub-pixel and may be implemented by a display element such as an OLED. Each of the main pixels Pm and/or the auxiliary pixels Pa may emit, for example, red, green, blue, or white light.

The first area DA1 may be surrounded by the second area DA2 or the peripheral area NDA. In FIG. 4, the second area DA2 may be on left and right sides of the first area DA1, and the peripheral area NDA may be above and under the first area DA1.

The main pixels Pm arranged in the first area DA1 may be electrically connected to outer circuits arranged in the peripheral area NDA, which is the non-display area. A first scan driving circuit 11, a second scan driving circuit 12, an emission control driving circuit 13, a terminal 14, and a first power supply wire 15 may be arranged in the peripheral area NDA. Although not shown, a second power supply wire may be arranged outside the first and second scan driving circuits 11 and 12, and the emission control driving circuit 13.

The first scan driving circuit 11 may provide a scan signal to each of the main pixels Pm through a scan line SL. The second scan driving circuit 12 may be arranged parallel to the first scan driving circuit 11 with the display area DA therebetween. Some of the main pixels Pm arranged in the display area DA may be electrically connected to the first scan driving circuit 11, and the others may be electrically connected to the second scan driving circuit 12. According to some example embodiments, the second scan driving circuit 12 may be omitted.

The emission control driving circuit 13 may be arranged close to the first scan driving circuit 11 and may provide an emission control signal to each of the main pixels Pm through an emission control line EL. Although FIG. 4 illustrates that the emission control driving circuit 13 is arranged only on one side of the display area DA, the emission control driving circuit 13 may be arranged on both sides of the display area DA, as in the first and second scan driving circuits 11 and 12.

The terminal 14 may be arranged in the peripheral area NDA of the substrate 100. The terminal 14 may be exposed by not being covered with an insulating layer, and thus may be electrically connected to a printed circuit board PCB. A terminal PCB-P of the printed circuit board PCB may be electrically connected to the terminal 14 of the display device 10.

The printed circuit board PCB may transmit a signal or power of a controller to the display device 10. A control signal generated by the controller may be transmitted to the first and second scan driving circuits 11 and 12, and the emission control driving circuit 13 through the printed circuit board PCB. Also, the controller may provide a driving voltage ELVDD (see FIG. 9A or 9B) to the first power supply wire 15 and provide a common voltage ELVSS (see FIG. 9A or 9B) to the second power supply wire. The driving voltage ELVDD may be provided to each of the main pixels Pm through a driving voltage line PL connected to the first power supply wire 15, and the common voltage ELVSS may be provided to an opposite electrode of a pixel connected to the second power supply wire. The first power supply wire 15 may extend in one direction (e.g., the x-direction) from below the second area DA2. The second power supply wire has a loop shape with one side open, and may at least partially overlap the second area DA2.

Also, according to some example embodiments, the controller generates a data signal, and the generated data signal may be transmitted to an input line IL through a data pad portion 17, and transmitted to the main pixel Pm and/or the auxiliary pixels Pa through a data line DL connected to the input line IL.

The auxiliary pixels Pa on the second area DA2 may at least partially overlap the first and second scan driving circuits 11 and 12, and the emission control driving circuit 13. The main pixels Pm on the first area DA1 each include a pixel circuit thereunder overlapping a first display element, but the auxiliary pixels Pa on the second area DA2 may each include the first and second scan driving circuits 11 and 12, and the emission control driving circuit 13 arranged thereunder overlapping a second display element. Accordingly, each of the auxiliary pixels Pa may receive a signal and/or a voltage from a pixel circuit of a main pixel Pm arranged in an area adjacent to the second area DA2, for example, the first area DA1.

Figure 6A:
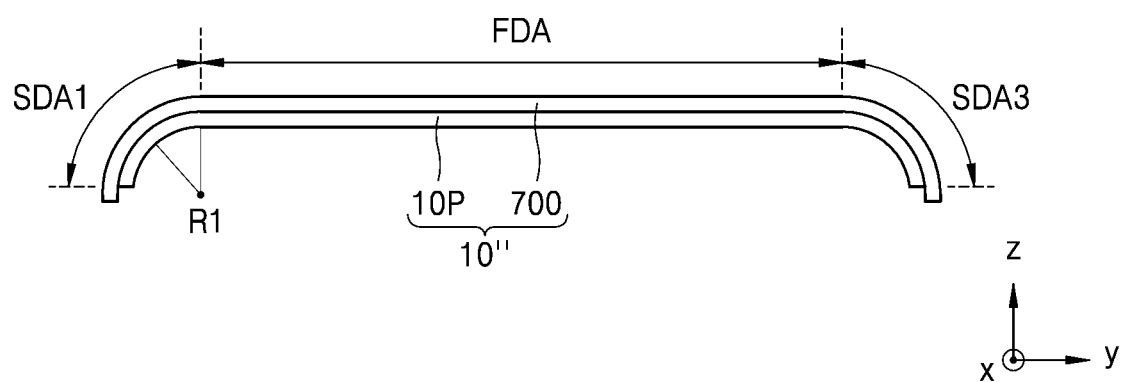
FIGS. 6A, 6B, and 6C are schematic cross-sectional views of an electronic apparatus according to some example embodiments.
Figure 6B:
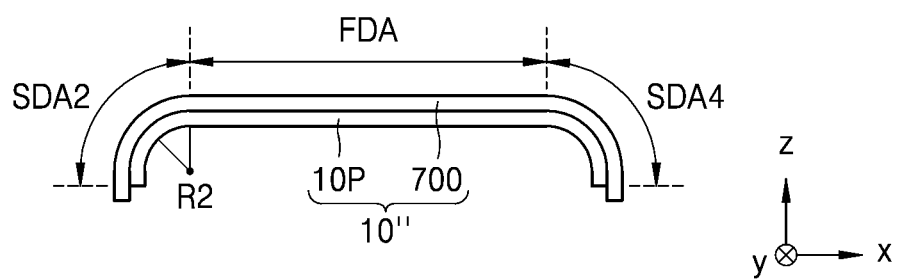
Figure 6C:
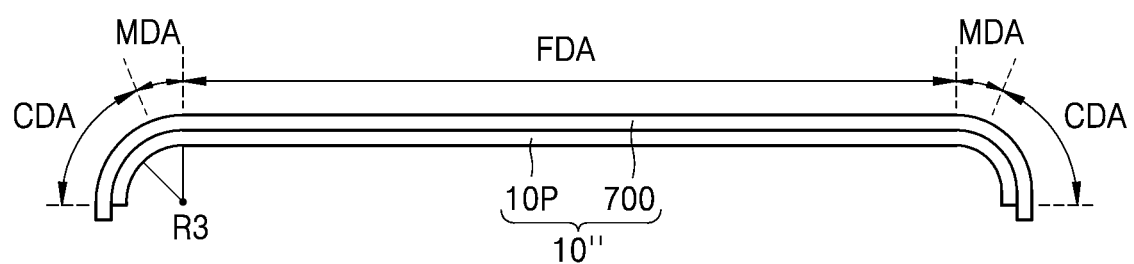

FIG. 5 is a schematic perspective view of an electronic apparatus 1" according to some example embodiments, and FIGS. 6A, 6B, and 6C are schematic cross-sectional views of an electronic apparatus 1" according to some example embodiments. FIG. 6A illustrates a cross-section of the electronic apparatus 1" in a y-direction of FIG. 5, FIG. 6B illustrates a cross-section of the electronic apparatus 1" in an x-direction of FIG. 5, and FIG. 6C illustrates a cross-section of the electronic apparatus 1", in which corner display areas CDA are arranged on both sides of a front display area FDA.

Referring to FIGS. 5 and 6A through 6C, the electronic apparatus 1" may have a long side in a first direction (e.g., the y-direction) and a short side in a second direction (e.g., the x-direction). Here, the first direction and the second direction may cross each other. Hereinbelow, a case where the first direction and the second direction cross at a right angle will be mainly described, but according to some example embodiments, the first direction and the second direction may cross at an acute angle or an obtuse angle. Also, according to some example embodiments, the electronic apparatus 1" may have a long side in the second direction (e.g., the x-direction) and a short side in the first direction (e.g., the y-direction).

A corner at which the long side in the first direction (e.g., the y-direction) meets the short side in the second direction (e.g., the x-direction) may be round to have a certain curvature.

The electronic apparatus 1" may include a display device 10". The display device 10" may include a display panel 10P and a cover window 700 for protecting an upper portion of the display panel 10P.

The cover window 700 may be a flexible window. The cover window 700 may protect the display panel 10P while being relatively easily bent according to an external force without cracking or the like. The cover window 700 may include glass, sapphire, or plastic. The cover window 700 may include, for example, an ultra-thin glass (UTG), a colorless polyimide (CPI). According to some example embodiments, the cover window 700 may have a structure in which a flexible polymer layer is arranged on one surface of a glass substrate, or may include only a polymer layer.

A stack structure of the display device 10" may be substantially similar to a structure of an upper portion of the substrate 100 described above with reference to FIG. 2A.

The display device 10" may include a display area DA that displays an image and a peripheral area NDA that surrounds the display area DA. The display area DA may include a plurality of pixels P1, P2, and P3, and an image may be displayed through the pixels P1, P2, and P3.

According to some example embodiments, the display area DA may include a front display area FDA, a side display area SDA, a corner display area CDA, and an intermediate display area MDA. The front display area FDA and the side display area SDA may correspond to the first area DA1 that displays a main image, and the corner display area CDA and the intermediate display area MDA may correspond to the second area DA2 that displays an auxiliary image. Accordingly, in the specification, it may be understood that first pixels P1 arranged on the front display area FDA and the side display area SDA correspond to the main pixels Pm, and second pixels P2 and third pixels P3 on the corner display area CDA and the intermediate display area MDA correspond to the auxiliary pixels Pa.

According to some example embodiments, the main pixels Pm on the first area DA1 and the auxiliary pixels Pa on the second area DA2 may have different shapes or different types of arrangement relationships. This will be described below in detail with reference to FIG. 11.

The pixels P1, P2, and P3 arranged in each display area DA may display an image. According to some example embodiments, each of the pixels P1, P2, and P3 in the front display area FDA, the side display area SDA, the corner display area CDA, and the intermediate display area MDA may provide an independent image. According to some example embodiments, each of the pixels P1, P2, and P3 in the front display area FDA, the side display area SDA, the corner display area CDA, and the intermediate display area MDA may provide a portion of an image.

The front display area FDA is a flat display area and may include a first pixel P1 including a first display element. According to some example embodiments, the front display area FDA may provide most of the image.

A pixel including a display element may be arranged in the side display area SDA. Accordingly, the side display area SDA may display an image. According to some example embodiments, the side display area SDA may include a first side display area SDA1, a second side display area SDA2, a third side display area SDA3, and a fourth side display area SDA4. According to some example embodiments, at least one of the first side display area SDA1, the second side display area SDA2, the third side display area SDA3, or the fourth side display area SDA4 may be omitted.

The first side display area SDA1 and the third side display area SDA3 may be connected to the front display area FDA in the first direction (e.g., the y-direction or a −y direction).

The first side display area SDA1 and the third side display area SDA3 each have a radius of curvature and may be bent. According to some example embodiments, the radii of curvature of the first side display area SDA1 and the third side display area SDA3 may be different from each other. According to some example embodiments, the radii of curvature of the first side display area SDA1 and the third side display area SDA3 may be equal to each other. Hereinbelow, a case where the first side display area SDA1 and the third side display area SDA3 have a same radius of curvature as a first radius of curvature R1 will be described in detail. Also, because the first side display area SDA1 and the third side display area SDA3 are identical or similar to each other, the first side display area SDA1 will be mainly described in detail.

The second side display area SDA2 and the fourth side display area SDA4 may be connected to the front display area FDA in the second direction (e.g., the x-direction or a −x direction).

The second side display area SDA2 and the fourth side display area SDA4 each have a radius of curvature and may be bent. According to some example embodiments, the radii of curvature of the second side display area SDA2 and the fourth side display area SDA4 may be different from each other. According to some example embodiments, the second side display area SDA2 and the fourth side display area SDA4 may be equal to each other. Hereinbelow, a case where the second side display area SDA2 and the fourth side display area SDA4 have a same radius of curvature as a second radius of curvature R2 will be described in detail. Also, because the second side display area SDA2 and the fourth side display area SDA4 are identical or similar to each other, the second side display area SDA2 will be mainly described in detail.

According to some example embodiments, the first radius of curvature R1 of the first side display area SDA1 may be different from the second radius of curvature R2 of the second side display area SDA2. For example, the first radius of curvature R1 may be less or greater than the second radius of curvature R2. According to some example embodiments, the first radius of curvature R1 of the first side display area SDA1 may be equal to the second radius of curvature R2 of the second side display area SDA2. Hereinbelow, a case where the first radius of curvature R1 is greater than the second radius of curvature R2 will be mainly described.

The corner display area CDA may be arranged at a corner of the front display area FDA and may be bent. That is, the corner display area CDA may be arranged to correspond to a corner portion CP. Here, the corner portion CP is a corner of the display area DA, and may be a portion where a long side of the display area DA in the first direction (e.g., the y-direction) meets a short side of the display area DA in the second direction (e.g., the x-direction). Also, the corner display area CDA may be between adjacent side display areas SDA. For example, the corner display area CDA may be between the first side display area SDA1 and the second side display area SDA2. Thus, the side display area SDA and the corner display area CDA may surround the front display area FDA and may be bent.

A second pixel P2 including a second display element may be arranged in the corner display area CDA. The corner display area CDA may display an image through the second pixel P2.

According to some example embodiments, when the first radius of curvature R1 of the first side display area SDA1 and the second radius of curvature R2 of the second side display area SDA2 are different from each other, a radius of curvature of the corner display area CDA may be gradually changed. According to some example embodiments, when the first radius of curvature R1 of the first side display area SDA1 is greater than the second radius of curvature R2 of the second side display area SDA2, the radius of curvature of the corner display area CDA may gradually decrease in a direction from the first side display area SDA1 to the second side display area SDA2. For example, a third radius of curvature R3 of the corner display area CDA may be less than the first radius of curvature R1 and greater than the second radius of curvature R2.

According to some example embodiments, the display area DA may further include an intermediate display area MDA. The intermediate display area MDA may be between the corner display area CDA and the front display area FDA. A third pixel P3 may be arranged in the intermediate display area MDA.

Also, according to some example embodiments, a driving circuit for providing an electrical signal or a power line for providing a voltage may be arranged in the intermediate display area MDA, and the third pixel P3 may overlap the driving circuit or the power line. In this case, a third display element of the third pixel P3 may be arranged above the driving circuit or the power line. According to some example embodiments, the driving circuit or the power line may be arranged in the peripheral area NDA, and the third pixel P3 may not overlap the driving circuit or the power line.

According to some example embodiments, the electronic apparatus 1" may display an image not only in the front display area FDA, but also in the side display area SDA, the corner display area CDA, and the intermediate display area MDA. Accordingly, the proportion occupied by the display area DA in the electronic apparatus 1" may be increased. Also, the electronic apparatus 1" includes the corner display area CDA that is bent at a corner and displays an image, thereby improving the aesthetics.

Figure 7:
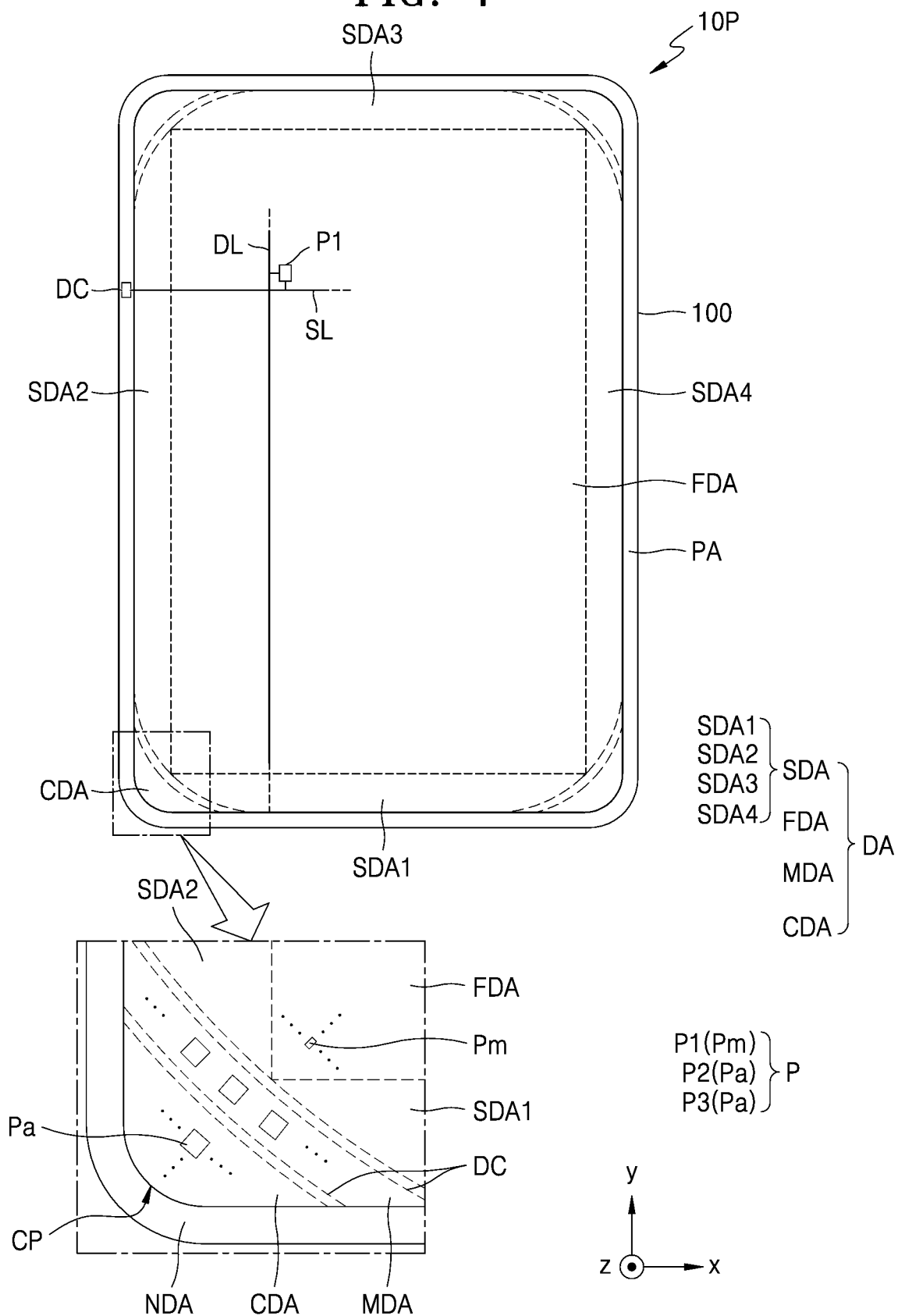
FIG. 7 is a schematic plan view of a display panel according to some example embodiments.

FIG. 7 is a schematic plan view of a display panel 10P according to some example embodiments. FIG. 7 schematically illustrates a shape of the display panel 10P being unbent, as a shape of the display panel 10P before a corner display area CDA is bent.

Referring to FIG. 7, the display panel 10P may include a display area DA and a peripheral area NDA. The display area DA is an area on which a plurality of pixels P1, P2, and P3 display an image, and the peripheral area NDA is an area surrounding at least a portion of the display area DA. The display area DA may include a front display area FDA, a side display area SDA, a corner display area CDA, and an intermediate display area MDA.

In the specification, a sub-pixel refers to an emission area as a minimum unit for implementing an image. When an OLED is used as a display element, the emission area may be defined by an opening of a pixel-defining layer. This will be described below.

The peripheral area NDA is an area that does not provide an image, which may be a non-display area. A driving circuit DC for providing an electrical signal to the pixels P, or a power line for providing power may be arranged in the peripheral area NDA. The driving circuit DC that provides an electrical signal to each pixel P through a signal line may be arranged in the peripheral area NDA. For example, the driving circuit DC may be a scan driving circuit that provides a scan signal to each pixel P through a scan line SL. Alternatively, the driving circuit DC may be a data driving circuit that provides a data signal to each pixel P through a data line DL. According to some example embodiments, the data driving circuit may be arranged adjacent to one side of the display panel 10P. For example, the data driving circuit in the peripheral area NDA may be arranged to correspond to the first side display area SDA1.

The peripheral area NDA may include a pad portion which is an area to which an electronic element or a printed circuit board may be electrically connected. The pad portion is exposed without being covered by an insulating layer, and thus may be electrically connected a flexible printed circuit board (FPCB). The FPCB may electrically connect the controller to the pad portion and supply a signal or power transmitted from the controller. According to some example embodiments, the data driving circuit may be arranged on the FPCB.

A first pixel P1 including a display element may be arranged in the front display area FDA. The front display area FDA may be a flat portion. According to some example embodiments, the front display area FDA may provide most of the image.

A pixel including a display element may be arranged in the side display area SDA. The pixel of the side display area SDA may be provided in a same shape and a same arrangement relationship as those of the first pixel P1 of the front display area FDA. According to some example embodiments, a width of the side display area SDA may gradually decrease in a direction away from the front display area FDA. As described above, the side display area SDA may include a first side display area SDA1, a second side display area SDA2, a third side display area SDA3, and a fourth side display area SDA4, which are respectively arranged on top, bottom, left, and right sides of the front display area FDA.

The corner display area CDA may be between adjacent side display areas SDA. Hereinbelow, a corner display area CDA between the first side display area SDA1 and the second side display area SDA2 will be mainly described in detail.

The corner display area CDA may surround at least a portion of the front display area FDA. For example, the corner display areas CDA may be between the first side display area SDA1 and the second side display area SDA2, to surround at least a portion of the front display area FDA.

A second pixel P2 including a display element may be arranged in the corner display area CDA, and the corner display area CDA may be bent. That is, as described with reference to FIG. 1, the corner display area CDA may be an area that is arranged to correspond to the corner portion CP and bent from the front display area FDA.

The intermediate display area MDA may be between the front display area FDA and the corner display area CDA. A third pixel P3 including a display element may be arranged in the intermediate display area MDA. Also, according to some example embodiments, a driving circuit DC for providing an electrical signal or a power line for providing a voltage may also be arranged in the intermediate display area MDA. According to some example embodiments, the driving circuit DC may pass through the intermediate display area MDA and be arranged along the peripheral area NDA. In this case, the third pixel P3 arranged in the intermediate display area MDA may overlap the driving circuit DC or the power line. According to some example embodiments, the third pixel P3 may not overlap the driving circuit DC or the power line. In this case, the driving circuit DC may be arranged along the peripheral area NDA.

At least one of the side display area SDA, the corner display area CDA, and the intermediate display area MDA may be bent. In this case, the first side display area SDA1 of the side display area SDA may be bent with a first radius of curvature, and the second side display area SDA2 of the side display area SDA may be bent with a second radius of curvature. In this case, when the first radius of curvature is greater than the second radius of curvature, a radius of curvature at which the corner display area CDA is bent may gradually decrease in a direction from the first side display area SDA1 to the second side display area SDA2.

When the corner display area CDA is bent, a greater compressive strain may occur in the corner display area CDA, compared to a tensile strain. In this case, a shrinkable substrate and a structure of a multi-layer need to be applied to the corner display area CDA. Accordingly, a stack structure of a multi-layer or a shape of a substrate 100 arranged in the corner display area CDA may be different from a stack structure of a multi-layer or a shape of a substrate 100 arranged in the front display area FDA.

Figure 8:
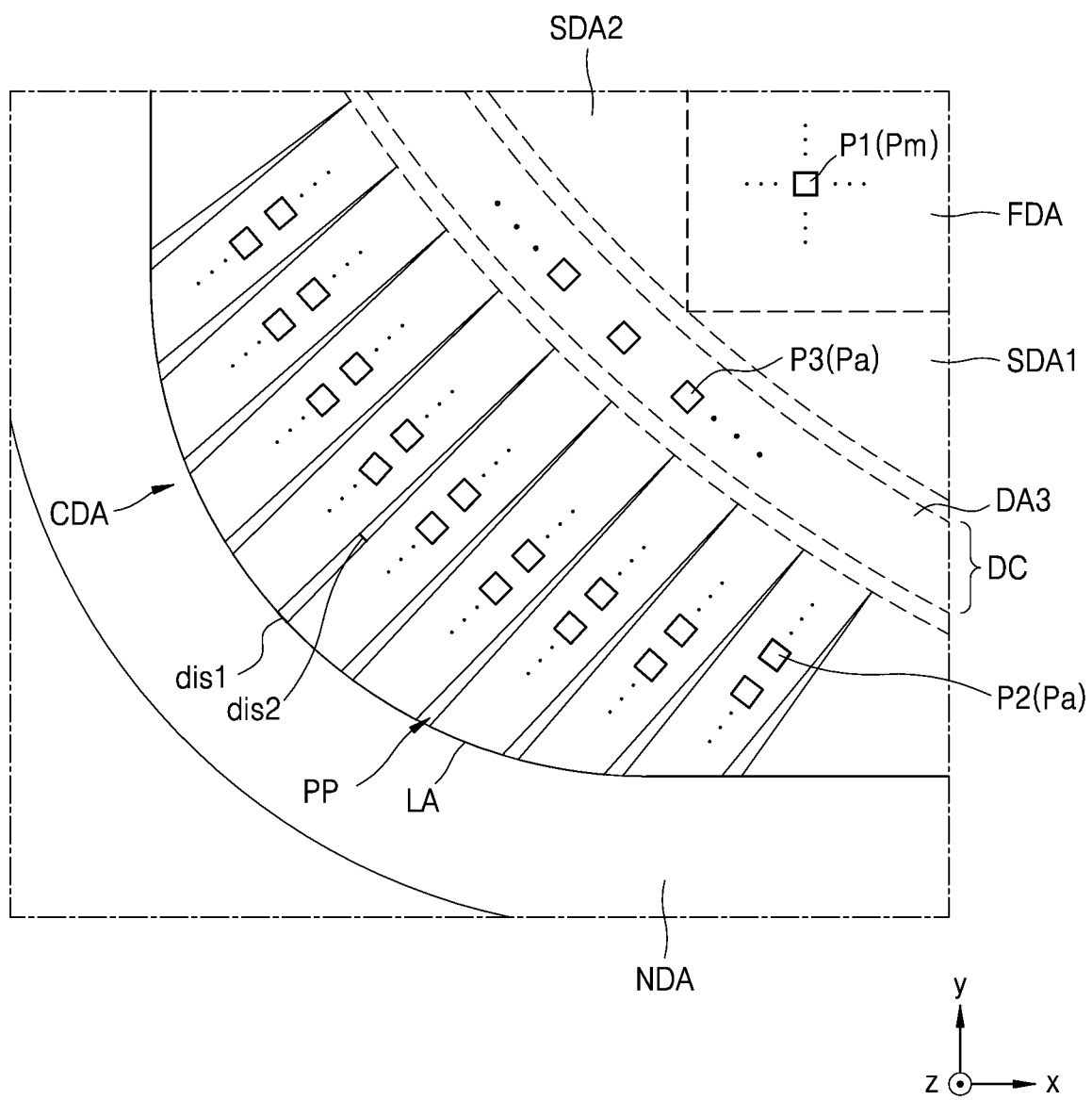
FIG. 8 is an enlarged view of a portion of a display panel according to some example embodiments.

FIG. 8 is an enlarged view of a portion of a display panel 10P according to some example embodiments.

Referring to FIG. 8, the display panel 10P may include a display area DA and a peripheral area NDA, and the display area DA may include a front display area FDA, side display areas SDA1 and SDA2, a corner display area CDA, and an intermediate display area MDA.

A first pixel P1 may be arranged in the front display area FDA, a second pixel P2 may be arranged in the corner display area CDA, and a third pixel P3 may be arranged in the intermediate display area MDA.

The corner display areas CDA may include a plurality of extension areas LA extending from the intermediate display area MDA. In this case, the extension areas LA may extend in a direction away from the front display area FDA. Second pixels P2 may be arranged in each of the extension areas LA. According to some example embodiments, the second pixels P2 may be arranged in a line along a direction in which the extension areas LA extend. According to some example embodiments, the second pixels P2 may be arranged in a plurality of lines along the direction in which the extension areas LA extend. Hereinbelow, a case where the second pixels P2 are arranged in a line along the direction in which the extension areas LA extend will be mainly described in detail.

A through portion PP may be between a plurality of adjacent extension areas LA. Accordingly, an empty space may be defined between the adjacent extension areas LA.

According to some example embodiments, a width of the through portion PP may gradually increase from the intermediate display area MDA toward ends of the extension areas LA. That is, the width of the through portion PP may increase in a direction away from the front display area FDA. For example, the extension areas LA may be radially arranged. In this case, the width of the through portion PP may indicate a distance between the adjacent extension areas LA. For example, a first width dis1 of the through portion PP at the ends of the extension areas LA may be greater than a second width dis2 of the through portion PP at a middle point between the ends of the extension areas LA and the intermediate display area MDA.

According to some example embodiments, the width of the through portion PP may be uniform along the direction in which the extension areas LA extend, from the intermediate display area MDA. In this case, the extension areas LA may extend in a same direction from the intermediate display area MDA.

According to some example embodiments, the extension areas LA may be connected to the peripheral area NDA. In this case, the extension areas LA may be fixed by the peripheral area NDA.

Figure 9A:
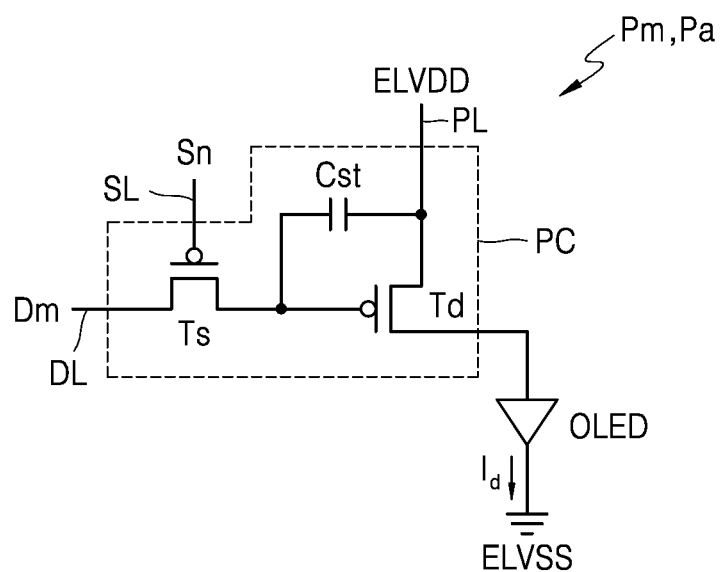
FIGS. 9A and 9B are equivalent circuit diagrams of pixels that may be included in a display device according to some example embodiments.
Figure 9B:
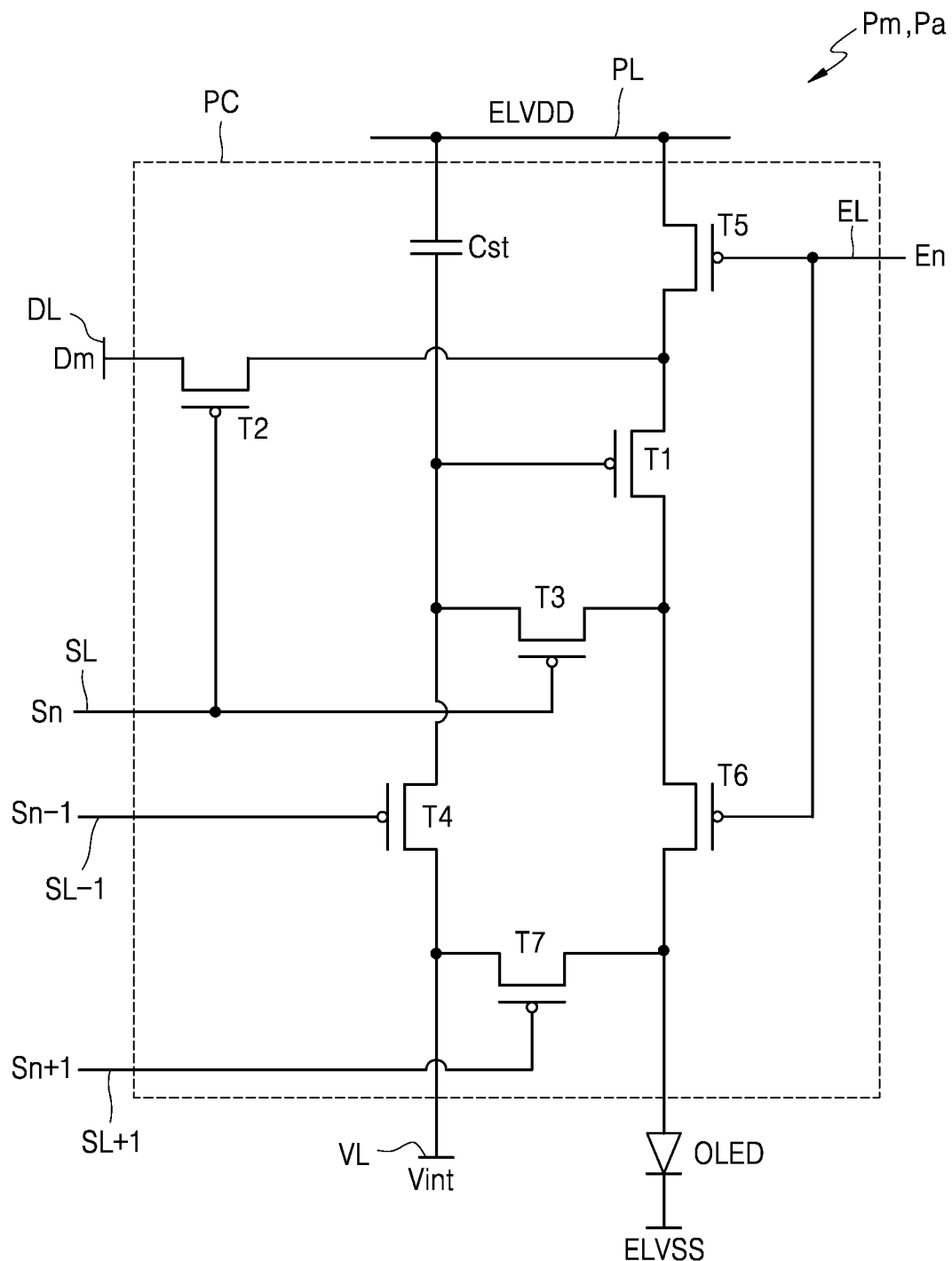

FIGS. 9A and 9B are equivalent circuit diagrams of pixels Pm and Pa that may be included in a display device according to some example embodiments.

Referring to FIGS. 9A and 9B, each of the pixels Pm and Pa includes a pixel circuit PC connected to a scan line SL and a data line DL, and an organic light-emitting diode OLED that is a display element connected to the pixel circuit PC. According to some example embodiments, the pixels Pm and Pa may include a pixel circuit PC of FIG. 9A or may include a pixel circuit PC of FIG. 9B. For example, a main pixel Pm may include the pixel circuit PC of FIG. 9B, and an auxiliary pixel Pa may include the pixel circuit PC of FIG. 9A. As another example, both the main pixel Pm and the auxiliary pixel Pa may include the pixel circuit PC of FIG. 9B.

The pixel circuit PC of FIG. 9A includes a driving thin-film transistor Td, a switching thin-film transistor Ts, and a storage capacitor Cst. The switching thin-film transistor Ts is connected to the scan line SL and the data line DL and transmits a data signal Dm to the driving thin-film transistor Td in response to a scan signal Sn input through the scan line SL, the data signal Dm being input through the data line DL.

The storage capacitor Cst is connected to the switching thin-film transistor Ts and a driving voltage line PL, and stores a voltage corresponding to a difference between a voltage received from the switching thin-film transistor Ts and a driving voltage ELVDD supplied to the driving voltage line PL.

The driving thin-film transistor Td is connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a certain luminance according to a driving current $I_d$.

Although it is shown in FIG. 9A that the pixel circuit PC includes two thin-film transistors and one storage capacitor, the embodiments are not limited thereto. According to some example embodiments, the pixel circuit PC may include seven thin-film transistors and one storage capacitor as shown in FIG. 9B which will be described below. According to some example embodiments, the pixel circuit PC may include two or more storage capacitors.

Referring to FIG. 9B, the pixel circuit PC may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

Though it is shown in FIG. 9B that each pixel circuit PC includes signal lines SL, SL−1, SL+1, EL, and DL, an initialization voltage line VL, and a driving voltage line PL, the embodiments are not limited thereto. According to some example embodiments, at least one of the signal lines SL, SL−1, SL+1, EL, or DL, and/or the initialization voltage line VL may be shared by adjacent pixel circuits PC.

A drain electrode of the driving thin-film transistor T1 may be electrically connected to the organic light-emitting diode OLED through the emission control thin-film transistor T6. The driving thin-film transistor T1 receives a data signal Dm depending on a switching operation of the switching thin-film transistor T2 and supplies a driving current to the organic light-emitting diode OLED.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1 and connected to the driving voltage line PL through the operation control thin-film transistor T5.

The switching thin-film transistor T2 is turned on according to the scan signal Sn received through the scan line SL and performs a switching operation of transmitting the data signal Dm received through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and connected to a pixel electrode of the organic light-emitting diode OLED through the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1. The compensation thin-film transistor T3 is turned on according to the scan signal Sn received through the scan line SL and connects the gate electrode and the drain electrode of the driving thin-film transistor T1 to each other, so as to cause the driving thin-film transistor T1 to be diode-connected.

A gate electrode of the first initialization thin-film transistor T4 may be connected to a previous scan line SL−1. A drain electrode of the first initialization thin-film transistor T4 may be connected to the initialization voltage line VL. A source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line SL−1, and may transmit an initialization voltage Vint to the gate electrode of the driving thin-film transistor T1, so as to perform an initialization operation of initializing a voltage of the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 are simultaneously (or concurrently) turned on in response to an emission control signal En received through the emission control line EL, the driving voltage ELVDD is transmitted to the organic light-emitting diode OLED, and the driving current flows through the main organic light-emitting diode OLED.

A gate electrode of the second initialization thin-film transistor T7 may be connected to a subsequent scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to a subsequent scan signal Sn+1 received through the subsequent scan line SL+1 and initialize the pixel electrode of the organic light-emitting diode OLED.

Although it is shown in FIG. 9B that the first initialization thin-film transistor T4 and the second initialization thin-film transistor T7 are connected to the previous scan line SL−1 and the subsequent scan line SL+1, respectively, the embodiments are not limited thereto. According to some example embodiments, the first initialization thin-film transistor T4 and the second initialization thin-film transistor T7 may be all connected to the previous scan line SL−1 and may be driven according to a previous scan signal Sn−1.

The other electrode of the storage capacitor Cst may be connected to the driving voltage line PL. Any electrode of the storage capacitor Cst may be connected to the gate electrode of the driving thin-film transistor T1, the drain electrode of the compensation thin-film transistor T3, and the source electrode of the first initialization thin-film transistor T4.

An opposite electrode (e.g., a cathode electrode) of the organic light-emitting diode OLED receives a common voltage ELVSS. The organic light-emitting diode OLED receives a driving current from the driving thin-film transistor T1 to emit light.

The pixel circuit PC is not limited to the number of thin-film transistors, the number of storage capacitors, and the circuit designs all described above with reference to FIGS. 9A and 9B. The number of thin-film transistors, the number of storage capacitors, and the circuit designs may vary.

Figure 10:
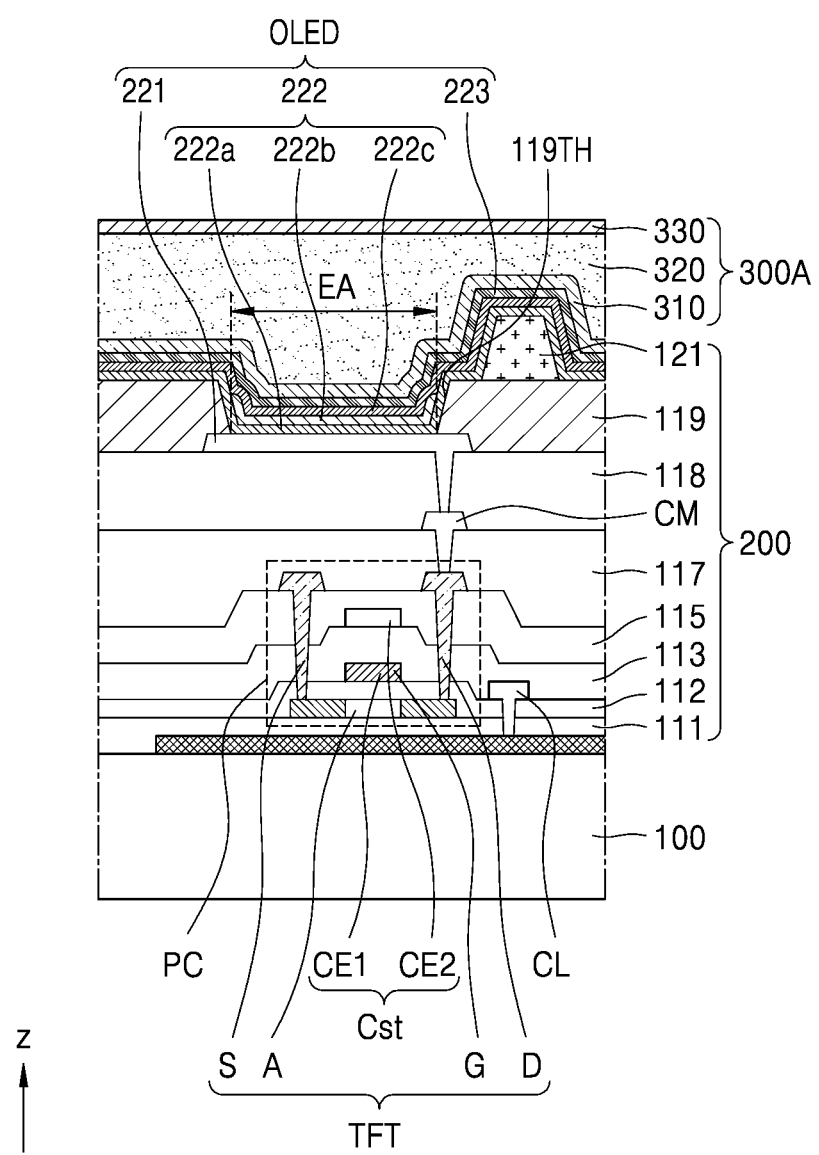
FIG. 10 is a cross-sectional view of a portion of a display panel of a display device according to some example embodiments.

FIG. 10 is a cross-sectional view of a portion of a display panel of a display device according to some example embodiments. FIG. 10 illustrates a portion of the display panel, in which a substrate 100, a display layer 200, and an encapsulation member may be included. According to some example embodiments, FIG. 10 illustrates a thin-film encapsulation layer 300A as the encapsulation member.

Referring to FIG. 10, the substrate 100 may have a multi-layered structure. The substrate 100 may include glass, a metal, or a polymer resin. According to some example embodiments, when the substrate 100 needs to be flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each containing such a polymer resin and a barrier layer containing an inorganic material (such as silicon oxide, silicon nitride, silicon oxynitride, etc.) between the two layers. Various modifications may be made.

A buffer layer 111 may reduce or block the penetration of foreign materials, moisture, or ambient air from a lower portion of the substrate 100 and may provide a flat surface on the substrate 100. The buffer layer 111 may include an inorganic insulating material such as silicon oxide, silicon oxynitride, or silicon nitride, and may have a single-layered or multi-layered structure including the aforementioned material.

In some cases, a bottom metal layer BML may be between the substrate 100 and the buffer layer 111. The bottom metal layer BML may include a conductive metal, such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

The bottom metal layer BML may be electrically connected to a conductive line CL. The conductive line CL may be electrically connected to a gate electrode, a source electrode, or a drain electrode of a thin-film transistor TFT to be described below, or may be electrically connected to one of capacitor plates of a storage capacitor Cst to be described below. Alternatively, the conductive line CL may be electrically connected to the driving voltage line PL (see FIG. 4). The bottom metal layer BML may be electrically connected to the gate electrode, the source electrode, or the drain electrode of the thin-film transistor TFT by the conductive line CL, may be electrically connected to one of the capacitor plates of the storage capacitor Cst, or may be electrically connected to the driving voltage line PL (see FIG. 4). The bottom metal layer BML connected to the conductive line CL may protect the thin-film transistor TFT from external static electricity or relatively improve the performance of the thin-film transistor TFT.

A pixel circuit PC including the thin-film transistor TFT and the storage capacitor Cst may be arranged on the buffer layer 111. The thin-film transistor TFT may include a semiconductor layer A, a gate electrode G overlapping a channel region of the semiconductor layer A, and a source electrode S and a drain electrode D respectively connected to a source region and a drain region of the semiconductor layer A. A gate insulating layer 112 may be between the semiconductor layer A and the gate electrode G, and a first interlayer insulating layer 113 and a second interlayer insulating layer 115 may be arranged between the gate electrode G and the source electrode S or between the gate electrode G and the drain electrode D.

The storage capacitor Cst may overlap the thin-film transistor TFT. The storage capacitor Cst may include a first capacitor plate CE1 and a second capacitor plate CE2 which overlap each other. According to some example embodiments, the gate electrode G of the thin-film transistor TFT may include the first capacitor plate CE1 of the storage capacitor Cst. The first interlayer insulating layer 113 may be between the first capacitor plate CE1 and the second capacitor plate CE2.

The semiconductor layer A may include polycrystalline silicon. In some embodiments, the semiconductor layer A may include amorphous silicon. In some embodiments, the semiconductor layer A may include an oxide of at least one material selected from the group consisting of indium (In), gallium (Ga), stannium (Sn), zirconium (Zr), vanadium (V), hafnium (Hf), cadmium (Cd), germanium (Ge), Cr, Ti, and zinc (Zn). The semiconductor layer A may include a channel region, and a source region and a drain region doped with impurities.

The gate insulating layer 112 may include an inorganic insulating material such as silicon oxide, silicon oxynitride, or silicon nitride, and may have a single-layered or multi-layered structure including the aforementioned material.

The gate electrode G or the first capacitor plate CE1 may include a low-resistance conductive material such as Mo, Al, Cu, and/or Ti, and may have a single-layered or multi-layered structure including the aforementioned material.

The first interlayer insulating layer 113 may include an inorganic insulating material such as silicon oxide, silicon oxynitride, and silicon nitride, and may have a single-layered or multi-layered structure including the aforementioned material.

The second capacitor plate CE2 may include Al, Pt, Pd, Ag, Mg, Au, Ni, Nd, Ir, Cr, Li, Ca, Mo, Ti, W, and/or Cu, and may have a single-layered or multi-layered structure including the aforementioned material.

The second interlayer insulating layer 115 may include an inorganic insulating material such as silicon oxide, silicon oxynitride, and silicon nitride, and may have a single-layered or multi-layered structure including the aforementioned material.

The source electrode S or the drain electrode D may include Al, Pt, Pd, Ag, Mg, Au, Ni, Nd, Ir, Cr, Ni, Ca, Mo, Ti, W, and/or Cu, and may have a single-layered or multi-layered structure including the aforementioned material. For example, the source electrode S or the drain electrode D may have a three-layered structure of a titanium layer/aluminum layer/titanium layer.

A planarization insulating layer 117 may include at least one inorganic insulating layer arranged thereunder, for example, a different material from the gate insulating layer 112, the first interlayer insulating layer 113, and the second interlayer insulating layer 115. The planarization insulating layer 117 may include an organic insulating material such as acryl, benzocyclobutene (BCB), polyimide, or hexamethyldisiloxane (HMDSO).

The pixel electrode 221 may be formed on the planarization insulating layer 117. The pixel electrode 221 may be electrically connected to the thin-film transistor TFT through a contact hole formed in the planarization insulating layer 117.

The pixel electrode 221 may include a reflective layer including Ag, Mg, Al, Pt, Pd, Au, Ni, Nd, Ir, Cr, or a compound thereof. The pixel electrode 221 may include a reflective layer including the aforementioned material, and a transparent conductive layer arranged above and/or under the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may have a three-layered structure of an ITO layer/Ag layer/ITO layer which are sequentially stacked.

A pixel-defining layer 119 may include a through hole 119TH that covers an edge of the pixel electrode 221 and exposes a center of the pixel electrode 221. The pixel-defining layer 119 may include an organic insulating material such as BCB, polyimide, or HMDSO. The through hole 119TH of the pixel-defining layer 119 may define an emission area EA, and red, green, or blue light may be emitted through the emission area EA. The area or width of the emission area EA may define the area or width of a pixel.

A spacer 121 may be formed on the pixel-defining layer 119. The spacer 121 may prevent or reduce instances of layers under the spacer 121 being damaged due to a mask in a process of forming an intermediate layer 222 to be described below. According to some example embodiments, the spacer 121 may include a same material as or a different material from the pixel-defining layer 119. For example, when the spacer 121 includes the same material as the pixel-defining layer 119, the spacer 121 and the pixel-defining layer 119 may be formed as one body through a half-tone mask.

The intermediate layer 222 includes an emission layer 222b overlapping the pixel electrode 221. The emission layer 222b may include an organic material. The emission layer 222b may include a polymer organic material or low molecular weight organic material emitting light having a certain color. As described above, the emission layer 222b may be formed through a deposition process using a mask.

A first functional layer 222a and a second functional layer 222c may be arranged under and/or on the emission layer 222b, respectively.

The first functional layer 222a may include a single layer or a multi-layer. For example, when the first functional layer 222a includes a polymer material, the first functional layer 222a may include a hole transport layer (HTL), which has a single-layered structure, and include poly-(3,4)-ethylenedihydroxy thiophene (PEDOT) or polyaniline (PAN). When the first functional layer 222a includes a low molecular weight material, the first functional layer 222a may include a hole injection layer (HIL) and an HTL.

The second functional layer 222c may be optionally provided. For example, when the first functional layer 222a and the emission layer 222b include a polymer material, the second functional layer 222c may be formed. The second functional layer 222c may include a single layer or a multi-layer. The second functional layer 222c may include an electron transport layer (ETL) and/or an electron injection layer (EIL).

The first functional layer 222a and the second functional layer 222c may be formed as one body to entirely cover a display area. As shown in FIG. 10, the first functional layer 222a and the second functional layer 222c may be formed as one body over the display area.

An opposite electrode 223 may include a conductive material having a relatively low work function. For example, the opposite electrode 223 may include a (semi-)transparent layer including Ag, Mg, Al, Ni, Cr, Li, Ca, or an alloy thereof. Alternatively, the opposite electrode 223 may further include a layer such as ITO, IZO, ZnO, or $In2O3$ on the (semi-)transparent layer including the aforementioned material. According to some example embodiments, the opposite electrode 223 may include Ag and Mg.

A stack structure of the pixel electrode 221, the intermediate layer 222, and the opposite electrode 223, which are sequentially stacked, may form a light-emitting diode, for example, an organic light-emitting diode OLED. The display layer 200 including the pixel circuit PC, the insulating layers, and the organic light-emitting diode OLED may be covered with the thin-film encapsulation layer 300A.

The thin-film encapsulation layer 300A may include a first inorganic encapsulation layer 310, a second inorganic encapsulation layer 330, and an organic encapsulation layer 320 therebetween.

The first and second inorganic encapsulation layers 310 and 330 each may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by using a chemical vapor deposition method.

The organic encapsulation layer 320 may include a polymer-based material. The polymer-based material may include an acrylic resin, an epoxy resin, polyimide, and polyethylene. For example, the organic encapsulation layer 320 may include an acrylic resin, for example, polymethyl methacrylate, polyacrylic acid, etc. The organic encapsulation layer 320 may be formed by curing a monomer or applying a polymer.

Figure 11:
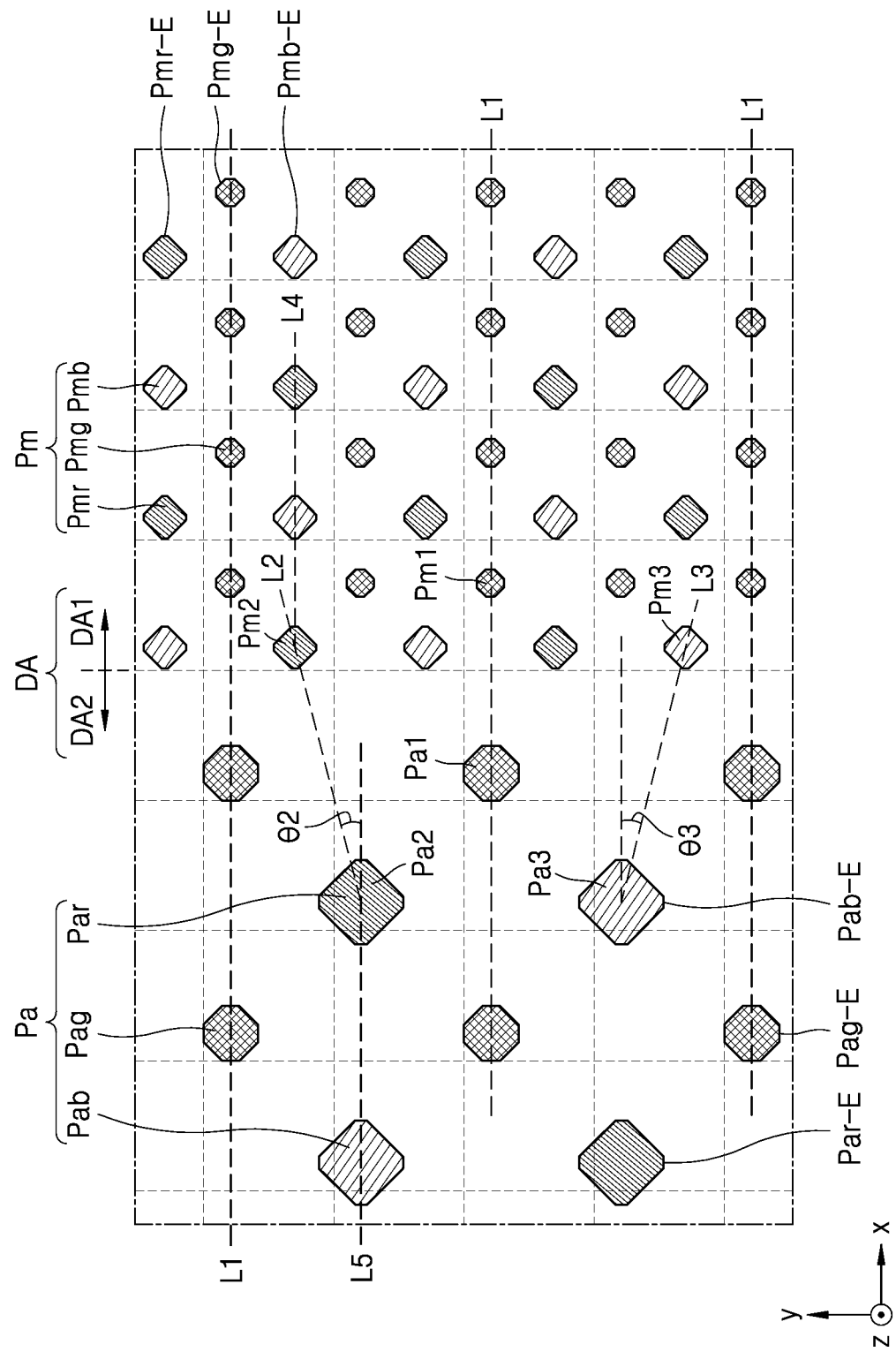
FIGS. 11 and 12 are schematic plan views of a portion of a display area according to some example embodiments.
Figure 12:
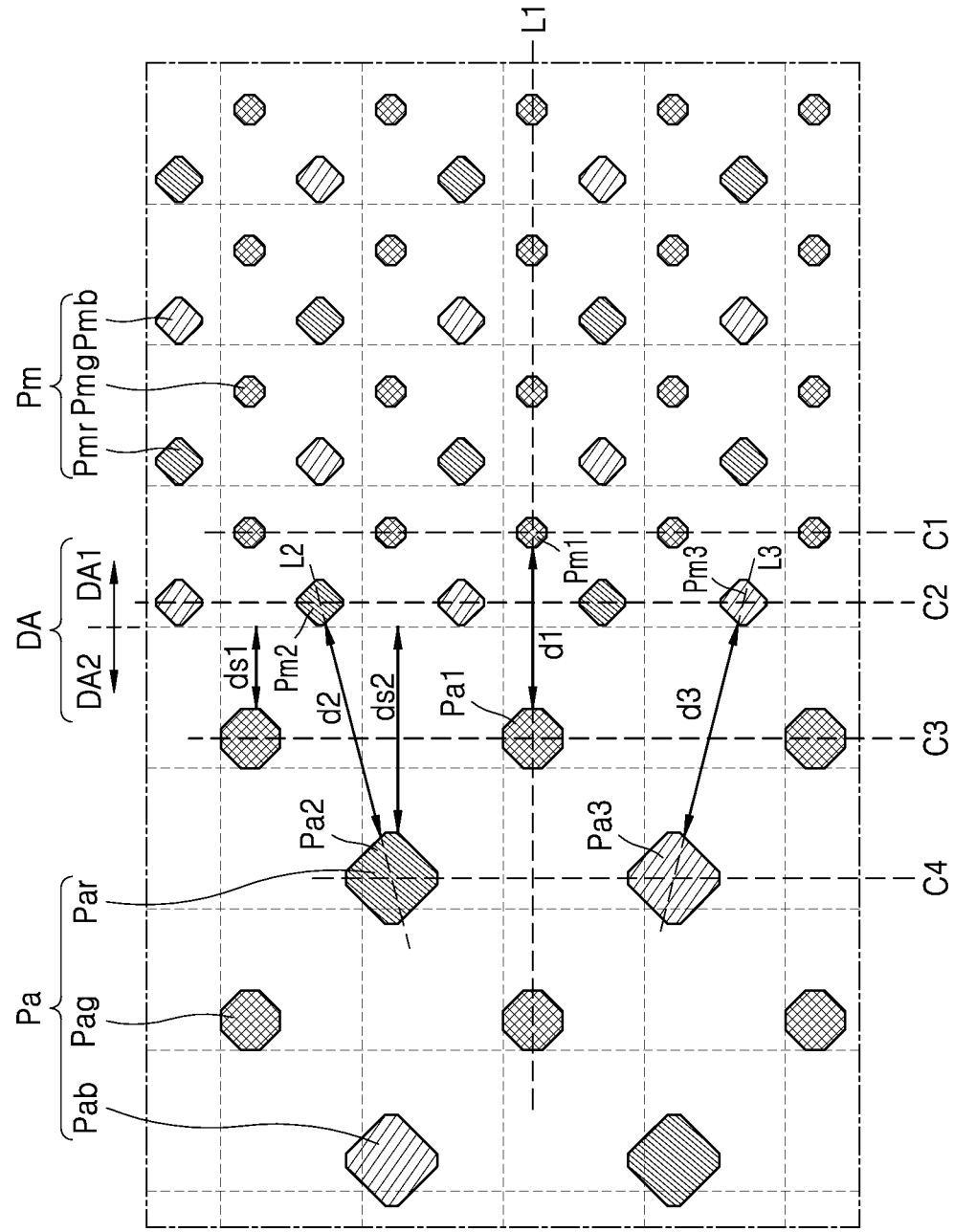

FIGS. 11 and 12 are schematic plan views of a portion of a display area DA according to some example embodiments.

Referring to FIG. 11, the display area DA includes a first area DA1 and a second area DA2 that are arranged so that at least portions thereof are in contact with each other. An image may be provided in the first area DA1 and the second area DA2 through an array of a plurality of pixels Pm and Pa that are arranged two-dimensionally. Main pixels Pm may be arranged on the first area DA1, and auxiliary pixels Pa may be arranged on the second area DA2. The main pixels Pm may provide a main image, and the auxiliary pixels Pa may provide an auxiliary image.

Each of the main pixels Pm may include a red main pixel Pmr, a green main pixel Pmg, and a blue main pixel Pmb. According to some example embodiments, as shown in FIG. 11, the red main pixel Pmr, the green main pixel Pmg, and the blue main pixel Pmb may be arranged in a pentile type. According to some example embodiments, the red main pixel Pmr, the green main pixel Pmg, and the blue main pixel Pmb may also be arranged in a stripe type.

The red main pixel Pmr, the green main pixel Pmg, and the blue main pixel Pmb may have different sizes (or widths). For example, the red main pixel Pmr and the blue main pixel Pmb may be greater than the green main pixel Pmg. In this case, when the red main pixel Pmr and the blue main pixel Pmb are greater than the green main pixel Pmg, it may indicate that an emission area Pmr-E of the red main pixel Pmr and an emission area Pmb-E of the blue main pixel Pmb are greater than an emission area Pmg-E of the green main pixel Pmg.

Each of the auxiliary pixels Pa may include a red auxiliary pixel Par, a green auxiliary pixel Pag, and a blue auxiliary pixel Pab. According to some example embodiments, as shown in FIG. 11, the red auxiliary pixel Par, the green auxiliary pixel Pag, and the blue auxiliary pixel Pab may be arranged in a pentile type. According to some example embodiments, as shown in FIG. 12, the red auxiliary pixel Par, the green auxiliary pixel Pag, and the blue auxiliary pixel Pab may also be arranged in a stripe type.

The red auxiliary pixel Par, the green auxiliary pixel Pag, and the blue auxiliary pixel Pab may have different sizes (or widths). For example, the red auxiliary pixel Par and the blue auxiliary pixel Pab may be greater than the green auxiliary pixel Pag. In this case, when the red auxiliary pixel Par and the blue auxiliary pixel Pab are greater than the green auxiliary pixel Pag, it may indicate that an emission area Par-E of the red auxiliary pixel Par and an emission area Pab-E of the blue auxiliary pixel Pab are greater than an emission area Pag-E of the green auxiliary pixel Pag.

According to some example embodiments, a first main pixel Pm1 emitting light of a first color, a second main pixel Pm2 emitting light of a second color, a third main pixel Pm3 emitting light of a third color may be arranged on the first area DA1, and a first auxiliary pixel Pa1 emitting light of a first color, a second auxiliary pixel Pa2 emitting light of a second color, and a third auxiliary pixel Pa3 emitting light of a third color may be arranged on the second area DA2. According to some example embodiments, the first color may be green, and the second color and the third color may be blue or red.

In more detail, the first main pixel Pm1 and the first auxiliary pixel Pa1 may be pixels emitting a same color and may respectively correspond to, for example, the green main pixel Pmg and the green auxiliary pixel Pag, which are described above. Also, the second main pixel Pm2 and the second auxiliary pixel Pa2 may be pixels emitting a same color and may respectively correspond to, for example, the red main pixel Pmr and the red auxiliary pixel Par, which are described above. Moreover, the third main pixel Pm3 and the third auxiliary pixel Pa3 may be pixels emitting a same color and may respectively correspond to, for example, the blue main pixel Pmb and the blue auxiliary pixel Pab, which are described above.

According to some example embodiments, the first main pixel Pm1 and the first auxiliary pixel Pa1, the second main pixel Pm2 and the second auxiliary pixel Pa2, and the third main pixel Pm3 and the third auxiliary pixel Pa3 may be pixels closest to each other at a boundary between the first area DA1 and the second area DA2.

According to some example embodiments, a first virtual line L1 passing through a center of an emission area of the first main pixel Pm1 and a center of an emission area of the first auxiliary pixel Pa1 may be parallel to a first direction (e.g., an x-direction). That is, the first main pixel Pm1 and the first auxiliary pixel Pa1 may be arranged parallel to each other on a same line. As described above, the first main pixel Pm1 and the first auxiliary pixel Pa1 may be pixels emitting green light. The pixels emitting green light have an emission area per pixel less than that of pixels emitting red or blue light, but are better recognized from the outside. That is, in order to improve visibility for high-quality images in the display area DA, the arrangement of the pixels emitting green light at the boundary between the first area DA1 and the second area DA2 serve as an important factor.

Therefore, in the display device according to some example embodiments, the first main pixel Pm1 and the first auxiliary pixel Pa1, which emit green light, in the first area DA1 and the second area DA2 may be arranged parallel to each other on a same line. Through this, the first main pixel Pm1 and the first auxiliary pixel Pa1 are consecutively arranged at substantially equal intervals, thereby improving visibility of the boundary between the first area DA1 and the second area DA2.

According to some example embodiments, a second virtual line L2 passing through a center of an emission area of the second main pixel Pm2 and a center of an emission area of the second auxiliary pixel Pa2 may cross the first direction (e.g., the x-direction). That is, the first virtual line L1 and the second virtual line L2 are not arranged parallel to each other. An angle between the second virtual line L2 and the first virtual line L1 may be greater than 0° and less than 90°, and may be, for example, 45° or less.

Similarly, a third virtual line L3 passing through a center of an emission area of the third main pixel Pm3 and a center of an emission area of the third auxiliary pixel Pa3 may cross the first direction (e.g., the x-direction). That is, the third virtual line L3 crosses the first virtual line L1 and the second virtual line L2 at the same time, but may not be parallel thereto. An angle between the third virtual line L3 and the first virtual line L1 may be greater than 0° and less than 90°, and may be, for example, 45° or less.

Also, the third virtual line L3 and the second virtual line L2 may cross each other, and an angle between the third virtual line L3 and the second virtual line L2 may be greater than the angle between the third virtual line L3 and the first virtual line L1 and the angle between the second virtual line L2 and the first virtual line L1.

When assuming a fourth virtual line L4 parallel to the first direction (e.g., the x-direction) on the first area DA1, the second main pixel Pm2 and the third main pixel Pm3 may be alternately arranged on the fourth virtual line L4. The fourth virtual line L4 may pass through the centers of the emission areas of the second main pixel Pm2 and the third main pixel Pm3. According to some example embodiments, the second auxiliary pixel Pa2 or the third auxiliary pixel Pa3 may not be arranged on the fourth virtual line L4. This may indicate that the second auxiliary pixel Pa2 or the third auxiliary pixel Pa3 is not arranged on a same line as the second main pixel Pm2 and the third main pixel Pm3 that are arranged on the first area DA1.

According to some example embodiments, an angle θ2 between a second main pixel Pm2 and a second auxiliary pixel Pa2 that are arranged closest to each other at the boundary between the first area DA1 and the second area DA2 may be greater than 0° and less than 90°, and for example, 45° or less, with respect to the first virtual line L1. Similarly, an angle θ3 between a third main pixel Pm3 and a third auxiliary pixel Pa3 that are arranged closest to each other at the boundary between the first area DA1 and the second area DA2 may be greater than 0° and less than 90°, and for example, 45° or less, with respect to the first virtual line L1.

In a similar point of view, a fifth virtual line L5 passing through the center of the emission area of the second auxiliary pixel Pa2 and the center of the emission area of the third auxiliary pixel Pa3 may be spaced apart from and arranged parallel to the fourth virtual line L4.

As described above, the second main pixel Pm2 and the second auxiliary pixel Pa2 may be pixels emitting red light, and the third main pixel Pm3 and the third auxiliary pixel Pa3 may be pixels emitting blue light. The pixels emitting red or blue light may have relatively low external visibility compared to pixels emitting green light. Therefore, even though the second main pixel Pm2 and the second auxiliary pixel Pa2, and the third main pixel Pm3 and the third auxiliary pixel Pa3, which emit red or blue light, are not arranged on a same line, the first main pixel Pm1 and the first auxiliary pixel Pa1, which emit green light, are consecutively arranged on a same line as described above, thereby reducing or minimizing visibility of the boundary between the first area DA1 and the second area DA2.

Referring to FIG. 12, at the boundary between the first area DA1 and the second area DA2, a shortest distance d1 between the first main pixel Pm1 and the first auxiliary pixel Pa1 may be less than a shortest distance d2 between the second main pixel Pm2 and the second auxiliary pixel Pa2 and a shortest distance d3 between the third main pixel Pm3 and the third auxiliary pixel Pa3.

According to some example embodiments, a shortest distance ds1 between the first auxiliary pixel Pa1 and the first area DA1 may be less than a shortest distance ds2 between the second auxiliary pixel Pa2 (or the third auxiliary pixel Pa3) and the first area DA1. That is, the first auxiliary pixel Pa1 may be arranged relatively closer to the first area DA1 than the second auxiliary pixel Pa2 and the third auxiliary pixel Pa3. The emission area of the first auxiliary pixel Pa1 emitting green light may be provided less than the emission areas of the second auxiliary pixel Pa2 and the third auxiliary pixel Pa3 emitting red or blue light. Accordingly, when the first auxiliary pixel Pa1 is arranged adjacent to the first area DA1, it may indicate that a pixel that is smallest in size is arranged adjacent to the first area DA1.

As shown in FIG. 12, in pixels emitting light of a same color, sizes of the auxiliary pixels Pa may be greater than sizes of the main pixels Pm. That is, sizes of the main pixels Pm in the first area DA1 that is provided as a main display area may be less than sizes of the auxiliary pixels Pa in the second area DA2 that is provided as an auxiliary display area. This is because the first area DA1 needs to display a main image, and thus needs to have a higher resolution, whereas the second area DA2 has a pixel structure (e.g., a pixel circuit structure) different from that of the first area DA1, and thus is difficult to have a same level of resolution as the first area DA1. Therefore, the sizes of the auxiliary pixels Pa may be provided greater than the sizes of the main pixels Pm. When the sizes of the auxiliary pixels Pa are greater than the sizes of the main pixels Pm, it may indicate that the area of an emission area of the auxiliary pixels Pa is greater than the area of an emission area of the main pixels Pm.

As described above, because the pixels emitting green light have relatively higher visibility than the pixels emitting red or blue light, a first auxiliary pixel Pa1 that is smallest in size among the auxiliary pixels Pa is arranged closer to the first area DA1, thereby reducing or minimizing visibility of the boundary between the first area DA1 and the second area DA2.

In the same context as described above, referring to the boundary between the first area DA1 and the second area DA2, the first main pixels Pm1 may be arranged on the first area DA1 along a first column C1 in a second direction (e.g., a y-direction). The second main pixels Pm2 and the third main pixels Pm3 may be alternately arranged along a second column C2 that is spaced apart from the first column C1. Also, the first auxiliary pixels Pa1 may be arranged on the second area DA2 along a third column C3 in the second direction (e.g., the y-direction). The second auxiliary pixels Pa2 and the third auxiliary pixels Pa3 may be alternately arranged along a fourth column C4 that is spaced apart from the third column C3.

That is, sizes of the pixels Pm and Pa sequentially arranged along the first to fourth columns C1 to C4 at the boundary between the first area DA1 and the second area DA2 may gradually increase. Through this, by making the pixels Pm and Pa at the boundary between the first area DA1 and the second area DA2 smoothly connected to each other, the visibility of the boundary may be reduced or minimized.

Figure 13:
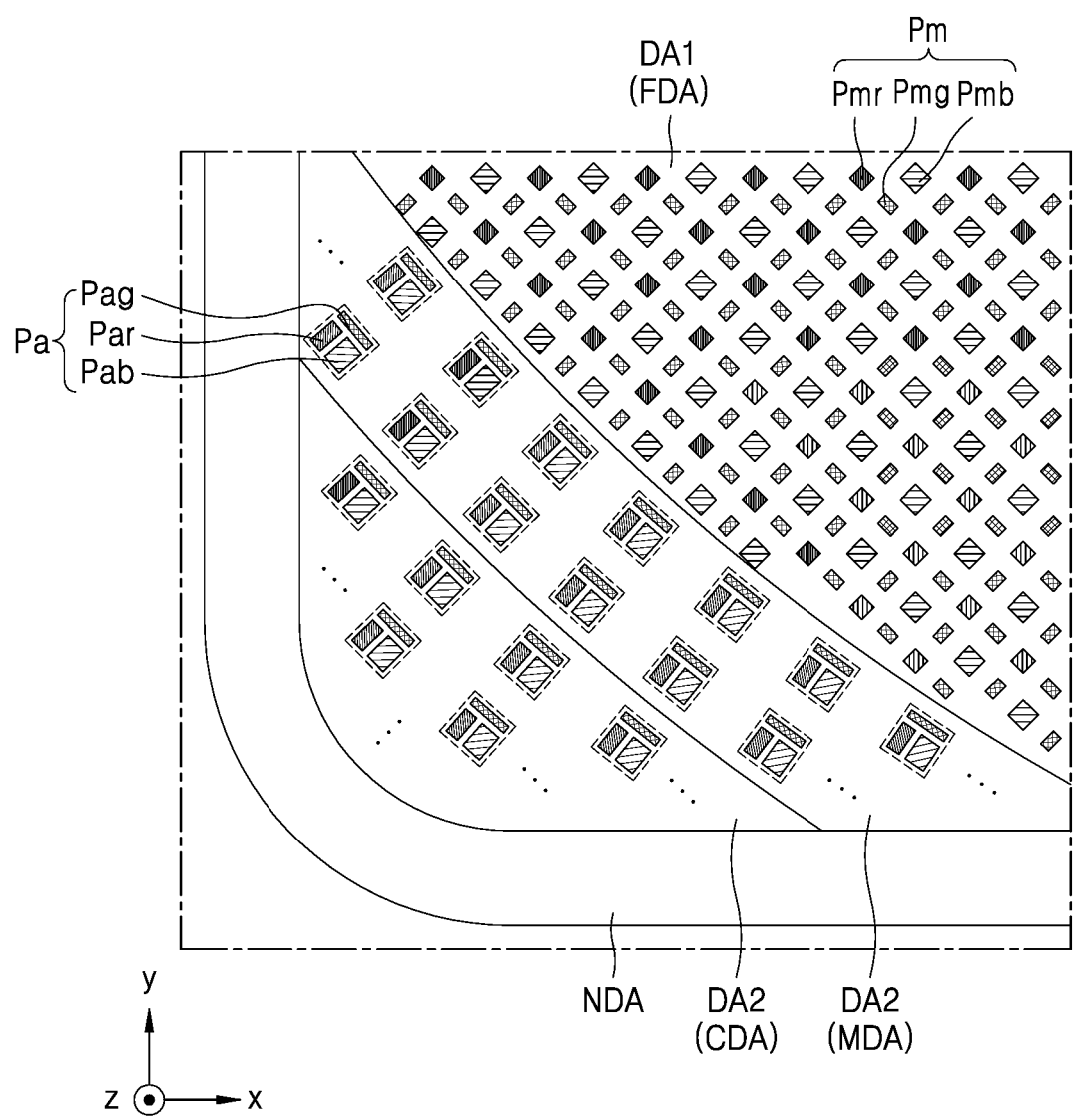
FIGS. 13 and 14 are schematic plan views of a portion of a display area according to some example embodiments.
Figure 14:
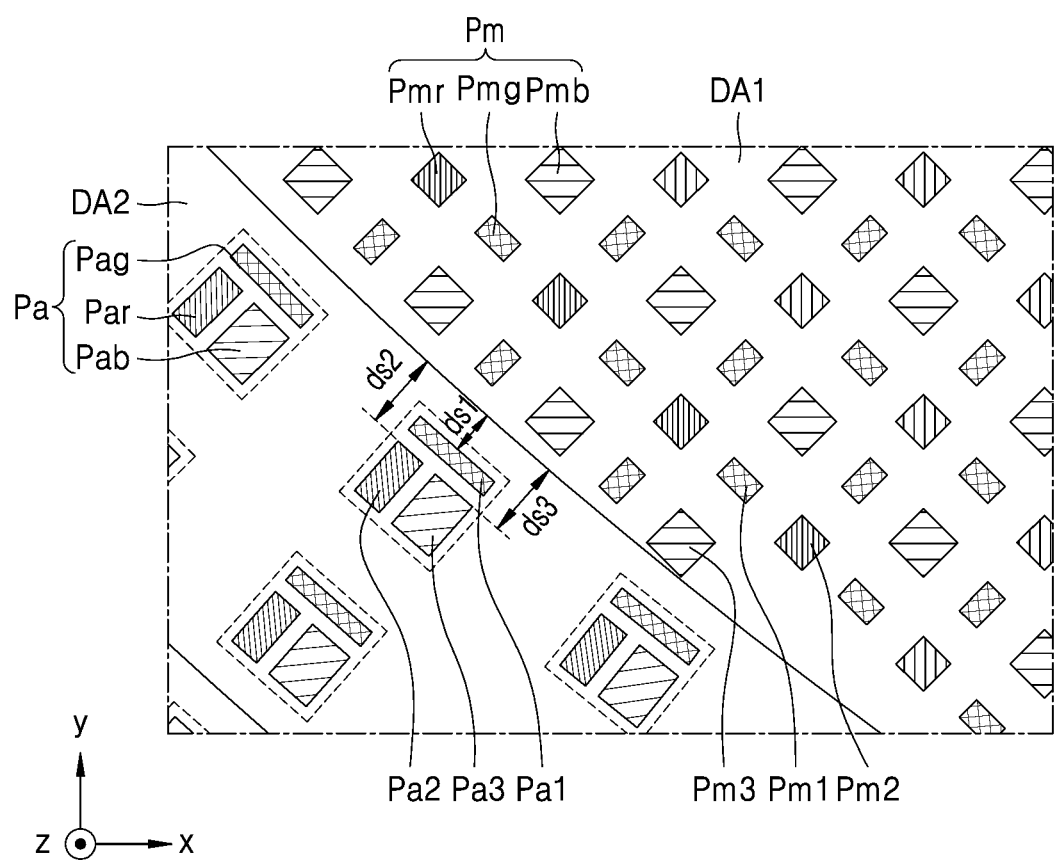

FIGS. 13 and 14 are schematic plan views of a portion of a display area according to some example embodiments. FIGS. 13 and 14 may be portions of the display device 10" of FIGS. 5 to 8 described above.

Referring to FIGS. 13 and 14, the display area DA may include a first area DA1 that displays a main image and a second area DA2 that displays an auxiliary image. As described above with reference to FIGS. 7 and 8, the first area DA1 may correspond to the front display area FDA and the side display area SDA, and the second area DA2 may correspond to the corner display area CDA and the intermediate display area MDA. In FIGS. 13 and 14, an area connected to the front display area FDA, the intermediate display area MDA, and the corner display area CDA is shown.

As described above, the main pixels Pm may be arranged in the first area DA1, and the auxiliary pixels Pa may be arranged in the second area DA2. The main pixels Pm may provide a main image, and the auxiliary pixels Pa may provide an auxiliary image. The main pixels Pm may include red main pixels Pmr, green main pixels Pmg, and blue main pixels Pmb, and the auxiliary pixels Pa may include red auxiliary pixels Par, green auxiliary pixels Pag, and blue auxiliary pixels Pab.

According to some example embodiments, the main pixels Pm on the first area DA1 may be arranged in a pentile type, and the auxiliary pixels Pa on the second area DA2 may be arranged in a stripe type. Hereinbelow, a case where the main pixels Pm on the first area DA1 and the auxiliary pixels Pa on the second area DA2 have different types of arrangements will be described.

In FIGS. 11 and 12 described above, a portion where the first area DA1 and the second area DA2 are in contact with each in a substantially straight line has been described. In FIGS. 13 and 14, it is shown that a side where the first area DA1 and the second area DA2 are in contact with each other is a diagonal line or a curved line.

According to some example embodiments, in pixels emitting light of a same color, sizes of the auxiliary pixels Pa may be greater than sizes of the main pixels Pm. Also, according to some example embodiments, the main pixels Pm and the auxiliary pixels Pa have different types of arrangements, and thus it is important to reduce visibility of the boundary between the first area DA1 and the second area DA2.

A first main pixel Pm1 emitting light of a first color, a second main pixel Pm2 emitting light of a second color, a third main pixel Pm3 emitting light of a third color may be arranged on the first area DA1, and a first auxiliary pixel Pa1 emitting light of a first color, a second auxiliary pixel Pa2 emitting light of a second color, and a third auxiliary pixel Pa3 emitting light of a third color may be arranged on the second area DA2. According to some example embodiments, the first color may be green, and the second color and the third color may be blue or red.

According to some example embodiments, the area of an emission area of the first main pixel Pm1 may be less than the areas of emission areas of the second main pixel Pm2 and the third main pixel Pm3, and the area of an emission area of the first auxiliary pixel Pa1 may be less than the areas of emission areas of the second auxiliary pixel Pa2 and the third auxiliary pixel Pa3. As described above, although the areas of the emission areas of the first main pixel Pm1 and the first auxiliary pixel Pa1, which emit green light, are relatively small compared to the areas of emission areas of pixels emitting light of different colors, the first main pixel Pm1 and the first auxiliary pixel Pa1 are excellent in external visibility.

Therefore, according to some example embodiments, the first auxiliary pixel Pa1 may be arranged closer to the first area DA1 than the second auxiliary pixel Pa2 and the third auxiliary pixel Pa3. That is, a shortest distance ds1 between the first auxiliary pixel Pa1 and the first area DA1 may be less than a shortest distance ds2 (or ds3) between the second auxiliary pixel Pa2 (or the third auxiliary pixel Pa3) and the first area DA1.

As described above, when the pixels Pm and Pa on the first area DA1 and the second area DA2 have different types of arrangements, as a comparative example, distances between the pixels Pm and Pa at the boundary between the first area DA1 and the second area DA2 are increased, so that the boundary between the first area DA1 and the second area DA2 is distinctly recognized, which may act as a cause of deteriorating the display quality over the display area DA.

Accordingly, according to some example embodiments, the first auxiliary pixel Pa1 with excellent visibility is adjacent closer to the first area DA1 than the second auxiliary pixel Pa2 and the third auxiliary pixel Pa3, and thus the same effect as pixels consecutively arranged at the boundary between the first area DA1 and the second area DA2 may be achieved.

Also, the first auxiliary pixel Pa1 has an emission area less than those of the second auxiliary pixel Pa2 and the third auxiliary pixel Pa3, thereby making a boundary between the auxiliary pixels Pa and the main pixels Pm, which are smaller in size than the auxiliary pixels Pa, less visible. Through this, sizes of the pixels gradually increase at the boundary between the first area DA1 and the second area DA2, and thus the visibility of the boundary between the first area DA1 and the second area DA2 may be reduced or minimized.

According to the embodiments made as described above, a display device in which visibility of a boundary is minimized in a display area may be implemented. However, the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display device comprising:
a substrate including a first area and a second area in contact with the first area;
a first main pixel and a second main pixel on the first area, the first main pixel being configured to emit light of a first color, and the second main pixel being configured to emit light of a second color; and
a first auxiliary pixel and a second auxiliary pixel on the second area, the first auxiliary pixel being configured to emit light of the first color, and the second auxiliary pixel being configured to emit light of the second color,
wherein a first virtual line passing through a center of an emission area of the first main pixel and a center of an emission area of the first auxiliary pixel is parallel to a first direction, and
a second virtual line passing through a center of an emission area of the second main pixel and a center of an emission area of the second auxiliary pixel crosses the first direction.

2. The display device of claim 1, wherein the first auxiliary pixel is closer to the first area than the second auxiliary pixel.

3. The display device of claim 1, wherein a shortest distance between the first main pixel and the first auxiliary pixel is less than a shortest distance between the second main pixel and the second auxiliary pixel.

4. The display device of claim 1, wherein an angle between the first virtual line and the second virtual line is 45° or less.

5. The display device of claim 1, wherein the first main pixel and the first auxiliary pixel are configured to emit green light.

6. The display device of claim 5, wherein the second main pixel and the second auxiliary pixel are configured to emit red or blue light.

7. The display device of claim 1, wherein a size of the emission area of the first main pixel is less than a size of the emission area of the second main pixel, and a size of the emission area of the first auxiliary pixel is less than a size of the emission area of the second auxiliary pixel.

8. The display device of claim 1, further comprising a third main pixel on the first area and configured to emit light of a third color, and a third auxiliary pixel on the second area and configured to emit light of the third color.

9. The display device of claim 8, wherein a third virtual line passing through a center of an emission area of the third main pixel and a center of an emission area of the third auxiliary pixel crosses the first direction.

10. The display device of claim 9, wherein the second virtual line and the third virtual line cross each other.

11. The display device of claim 8, wherein a fourth virtual line passing through each of the center of the emission area of the second main pixel and a center of an emission area of a third main pixel is spaced apart from and parallel to the first virtual line, and
the second auxiliary pixel is not on the fourth virtual line.

12. The display device of claim 11, further comprising a third auxiliary pixel on the second area and emitting light of a third color,
wherein a fifth virtual line passing through the center of the emission area of the second auxiliary pixel and a center of an emission area of the third auxiliary pixel is spaced apart from and parallel to the fourth virtual line.

13. The display device of claim 1, wherein the first main pixel and the first auxiliary pixel, which are on the first area, and the second main pixel and the second auxiliary pixel, which are on the second area, are each arranged in a pentile configuration.

14. The display device of claim 1, wherein a size of the emission area of the first auxiliary pixel is greater than a size of the emission area of the first main pixel.

15. A display device comprising:
a substrate including a first area and a second area in contact with the first area;
a first main pixel and a second main pixel on the first area, the first main pixel being configured to emit light of a first color, and the second main pixel being configured to emit light of a second color; and
a first auxiliary pixel and a second auxiliary pixel on the second area, the first auxiliary pixel being configured to emit light of the first color, and the second auxiliary pixel being configured to emit light of the second color,
wherein a size of an emission area of the first main pixel is less than a size of an emission area of the second main pixel, a size of an emission area of the first auxiliary pixel is less than a size of an emission area of the second auxiliary pixel, and
the first auxiliary pixel is closer to the first area than the second auxiliary pixel.

16. The display device of claim 15, wherein the first main pixel and the first auxiliary pixel are configured to emit green light.

17. The display device of claim 15, wherein the first main pixel and the first auxiliary pixel, and the second main pixel and the second auxiliary pixel are closest to each other at a boundary between the first area and the second area.

18. The display device of claim 17, wherein a shortest distance between the first main pixel and the first auxiliary pixel is less than a shortest distance between the second main pixel and the second auxiliary pixel.

19. The display device of claim 15, wherein the first main pixel and the second main pixel, which are on the first area, are in a pentile configuration, and the first auxiliary pixel and the second auxiliary pixel, which are on the second area, are in a stripe configuration.

20. The display device of claim 19, further comprising a component overlapping the second area.

21. The display device of claim 19, wherein the second area is at least one corner portion of the substrate, and
at least a portion of the substrate corresponding to the second area includes a through portion.

22. The display device of claim 16, wherein a first virtual line passing through a center of the emission area of the first main pixel and a center of the emission area of the first auxiliary pixel is parallel to a first direction.

23. The display device of claim 22, wherein a second virtual line passing through a center of the emission area of the second main pixel and a center of the emission area of the second auxiliary pixel crosses the first direction.

24. The display device of claim 23, wherein an angle between the first virtual line and the second virtual line is 45° or less.

25. The display device of claim 15, wherein a size of the emission area of the first auxiliary pixel is greater than a size of the emission area of the first main pixel.

26. An electronic apparatus comprising:
a display device including a first area and a second area in contact with the first area, the display device including an array of a plurality of main pixels on the first area, and an array of a plurality of auxiliary pixels on the second area; and
a component overlapping the second area,
wherein the display device includes:
a first main pixel and a second main pixel on the first area, the first main pixel being configured to emit light of a first color, and the second main pixel being configured to emit light of a second color; and
a first auxiliary pixel and a second auxiliary pixel on the second area, the first auxiliary pixel being configured to emit light of the first color, and the second auxiliary pixel being configured to emit light of the second color,
wherein a first virtual line passing through a center of an emission area of the first main pixel and a center of an emission area of the first auxiliary pixel is parallel to a first direction, and
a second virtual line passing through a center of the emission area of the second main pixel and a center of the emission area of the second auxiliary pixel crosses the first direction.

* * * * *